US008692623B2

(12) United States Patent
Shiga et al.

(10) Patent No.: US 8,692,623 B2
(45) Date of Patent: Apr. 8, 2014

(54) RELAXATION OSCILLATOR CIRCUIT INCLUDING TWO CLOCK GENERATOR SUBCIRCUITS HAVING SAME CONFIGURATION OPERATING ALTERNATELY

(75) Inventors: Seichiro Shiga, Kobe (JP); Tetsuya Hirose, Kobe (JP); Yuji Osaki, Kobe (JP)

(73) Assignee: Semiconductor Technology Academic Research Center, Kanagawa (JP)

( * ) Notice: Subject to any disclaimer, the term of this patent is extended or adjusted under 35 U.S.C. 154(b) by 0 days.

(21) Appl. No.: 13/591,340

(22) Filed: Aug. 22, 2012

(65) Prior Publication Data

US 2013/0049875 A1    Feb. 28, 2013

(30) Foreign Application Priority Data

Aug. 26, 2011  (JP) .................................. 2011-185043

(51) Int. Cl.
*H03K 3/0231* (2006.01)

(52) U.S. Cl.
USPC ................................ 331/111; 331/2; 331/145

(58) Field of Classification Search
USPC .............................................. 331/111, 145, 2
See application file for complete search history.

(56) References Cited

U.S. PATENT DOCUMENTS 7,375,599 B2 *  5/2008  Molina .......................... 331/143
8,085,102 B2 * 12/2011  Muller .......................... 331/111

OTHER PUBLICATIONS

Kunil Choe et al., "A Precision Relaxation Oscillator with a Self-Clocked Offset-Cancellation Scheme for Implantable Biomedical SoCs", 2009 IEEE International Solid-State Circuits Conference (ISSCC), Feb. 2009, pp. 402-403.
Yusuke Tokunaga et al., "An On-Chip CMOS Relaxation Oscillator With Voltage Averaging Feedback", IEEE Journal of Solid-State Circuits, vol. 45, No. 6, Jun. 2010, pp. 1150-1158.
"Flip-flop (electronics)", [online], [searched on Aug. 16, 2011], Internet <URL:http://en.wikipedia.org/wiki/Flip-flop_(electronics)>, pp. 1-15.
Kosuke Isono et al., "A PVT Variation Tolerant Clock Reference Circuit", Proceedings of the Institute of Electronics, Information and Communication Engineers general conference, C-12-20, Mar. 2010 (with partial English translation).

* cited by examiner

*Primary Examiner* — Arnold Kinkead
(74) *Attorney, Agent, or Firm* — Wenderoth, Lind & Ponack, L.L.P.

(57) ABSTRACT

A control circuit controls first and second clock generator subcircuits so that one subcircuit of the first and second clock generator subcircuits operates for a comparison voltage generating interval, then another subcircuit operates for a clock generating interval, and so that the first and second clock generator subcircuits alternately repeat processes of the comparison voltage generating interval and the clock generating interval. For the comparison voltage generating interval, each of the first and second clock generator subcircuits is controlled to generate a comparison voltage and output the same voltage to an inverted output terminal of a comparator. For the clock generating interval, each of the first and second clock generator subcircuits compares an output voltage from a current-voltage converter circuit with the comparison voltage.

5 Claims, 18 Drawing Sheets

RELAXATION OSCILLATOR CIRCUIT INCLUDING TWO CLOCK GENERATOR SUBCIRCUITS HAVING SAME CONFIGURATION OPERATING ALTERNATELY

BACKGROUND OF THE INVENTION

1. Field of the Invention

The present invention relates to a relaxation oscillator circuit for generating a clock. In particular, the present invention relates to a relaxation oscillator circuit including two clock generator subcircuit.

2. Description of the Related Art

In recent years, due to the development of a number of micro systems such as implanted devices for use in medical applications and sensor devices, Large Scale Integrations (LSIs) are required to operate with a ultralow power. Therefore, a clock generator circuit to be mounted on an LSI is also required to operate with a low power, and is required to be on-chip mounted. A relaxation oscillator circuit is employed as a clock generator circuit that satisfies the above-described requirements. The relaxation oscillator circuit executes oscillating operation (referred to as a relaxation oscillating operation hereinafter) by charging and discharging a capacitor. However, the relaxation oscillator circuit has such a problem that a frequency (referred to as a clock frequency hereinafter) of a clock to be outputted therefrom fluctuates due to variations in the manufacturing processes of comparators for comparing a voltage across both terminals of the capacitor with a predetermined reference voltage. Concretely speaking, the clock frequency fluctuates, because an output signal from the comparator is delayed by a bias current of the comparator and a voltage level of the output signal from the comparator is not changed over at a desired timing due to an offset voltage of the comparator.

Prior art documents related to the present invention are listed below:

Non-Patent Document 1: K. Choe et al., "A Precision Relaxation Oscillator with a Self-Clocked Offset-Cancellation Scheme for Implantable Biomedical SoCs", 2009 IEEE International Solid-State Circuits Conference (ISSCC), pp. 402-403, February, 2009;

Non-Patent Document 2: Y. Tokunaga et al., "An On-Chip CMOS Relaxation Oscillator With Voltage Averaging Feedback", IEEE Journal of Solid-State Circuits, col. 45, No. 6, June 2010;

Non-Patent Document 3: "Flip-flop (electronics)", [online], [searched on Aug. 16, 2011], Internet <URL: http://en.wikipedia.org/wiki/Flip-flop_(electronics)>; and Non-Patent Document 4: K. Isono et al., "A PVT Variation Tolerant Clock Reference Circuit", Proceedings of the Institute of Electronics, Information and Communication Engineers general conference, C-12-20, March, 2010.

A relaxation oscillator circuit described in the Non-Patent Document 1 suppresses the fluctuations in the clock frequency by correcting the offset voltage of the comparator. In addition, a relaxation oscillator circuit described in the Non-Patent Document 2 generates a comparison voltage for use in the comparator by comparing an input voltage to the comparator with a reference voltage by using an integrator circuit. This removes the influences of the delay and the offset voltage of the comparator on the clock frequency.

However, according to the Non-Patent Document 1, it was not possible to suppress the fluctuations in the clock frequency caused by the delay of the comparator. In addition, according to the Non-Patent Document 2, there is such a problem that the clock frequency fluctuates due to the offset voltage of an op-amp used in the integrator circuit since the integrator circuit is newly employed. Further, because it is required to use a resistor having a relatively high resistance value in the integrator circuit, the circuit area could not be reduced.

SUMMARY OF THE INVENTION

It is an object of the present invention to provide a relaxation oscillator circuit capable of solving the above-described problems and capable of generating a clock having a frequency more constant than that of the prior art.

According to the present invention, there is provided a relaxation oscillator circuit including first and second clock generator subcircuits, and a control circuit configured to control the first and second clock generator subcircuits. Each of the first and second clock generator subcircuits includes a comparator having a non-inverted input terminal and an inverted input terminal, first and second current-voltage converter circuits, and a multiplexer. The first current-voltage converter circuit includes a first capacitor having a grounded first electrode and a second electrode. The first current-voltage converter circuit outputs, as a first output voltage, a voltage of the second electrode of the first capacitor upon charging the first capacitor with a first constant current. The multiplexer is configured to output one of the first output voltage and a predetermined reference voltage, to the non-inverted input terminal of the comparator. The second current-voltage converter circuit includes a second capacitor having first and second electrodes, the first electrode being connected to a power source that outputs a predetermined power voltage and a second electrode. The second current-voltage converter circuit outputs, as a second output voltage, a voltage of the second electrode of the second capacitor upon discharging the second capacitor with a second constant current, to the inverted input terminal of the comparator. For a comparison voltage generating interval, the control circuit grounds the second electrode of the first capacitor, controls the multiplexer to output the reference voltage to the non-inverted input terminal of the comparator, discharges the second capacitor with the second constant current after resetting the second electrode of the second capacitor to a predetermined reset voltage that is higher than the reference voltage and equal to or lower than the power voltage, and holds the second output voltage when a level of an output signal from the comparator is inverted as a comparison voltage of the comparator. For a clock generating interval, the control circuit controls the multiplexer to output the first output voltage to the non-inverted input terminal of the comparator, and charges the first capacitor with the first constant current until the level of the output signal from the comparator is inverted. The control circuit controls the first and second clock generator subcircuits, so that one subcircuit of the first and second clock generator subcircuits operates for the comparison voltage generating interval, then another subcircuit operates for the clock generating interval, and so that the first and second clock generator subcircuits alternately repeat processes of the comparison voltage generating interval and the clock generating interval. The control circuit generates a clock based on output signals from the comparators of the first and second clock generator subcircuits.

In the above-described relaxation oscillator circuit, the first current-voltage converter circuit preferably includes first and second switches. The first switch is connected to the second electrode of the first capacitor, and switches over between charging the first capacitor with the first constant current and not charging the first capacitor. The second is switch connected in parallel with the first capacitor. The second current-voltage converter circuit includes third and fourth switches. The third switch is connected to the second electrode of the second capacitor, and switches over between discharging the second capacitor with the second constant current and not discharging the second capacitor. The fourth switch is connected in parallel with the second capacitor. For the comparison voltage generating interval, the control circuit (a) controls the first switch not to charge the first capacitor and turns on the second switch, and controls the third switch not to discharge the second capacitor and turns on the fourth switch, (b) controls the third switch to discharge the second capacitor and turns off the fourth switch, (c) when the level of the output signal from the comparator is inverted, controls the third switch not to discharge the second capacitor and turns off the fourth switch. For the clock generating interval, the control circuit (d) controls the first switch to charge the first capacitor and turns off the second switch.

In addition, in the above-described relaxation oscillator circuit, the control circuit preferably includes a NAND gate configured to execute a non-conjunction operation on the respective output signals from the first and second clock generator subcircuits, and a flip-flop configured to detect respective falling edges of an output signal from the NAND gate, and generate the clock based on timings of respective detected falling edges.

Further, in the above-described relaxation oscillator circuit, capacitances of the first and second capacitors of the first and second clock generator subcircuits are preferably set to substantially same value as each other, and current values of the first and second constant currents are set to substantially same current value as each other.

Still further, in the above-described relaxation oscillator circuit, the comparison voltage preferably includes the reference voltage and an error voltage of the comparator.

According to the relaxation oscillator circuit of the present invention, for the comparison voltage generating interval, the control circuit holds the second output voltage when the level of the output signal from the comparator is inverted as the comparison voltage of the comparator. For the clock generating interval, the control circuit charges the first capacitor with the first constant current until the level of the output signal from the comparator is inverted. In addition, the control circuit controls the first and second clock generator subcircuits, so that one subcircuit of the first and second clock generator subcircuits operates for the comparison voltage generating interval, then another subcircuit operates for the clock generating interval, and so that the first and second clock generator subcircuits alternately repeat processes of the comparison voltage generating interval and the clock generating interval. The control circuit generates a clock based on output signals from the comparators of the first and second clock generator subcircuits. Therefore, according to the relaxation oscillator circuit of the present invention, it is possible to generate a clock having a frequency more constant than that of the prior art.

BRIEF DESCRIPTION OF THE DRAWINGS

These and other objects and features of the present disclosure will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

Figure 1:
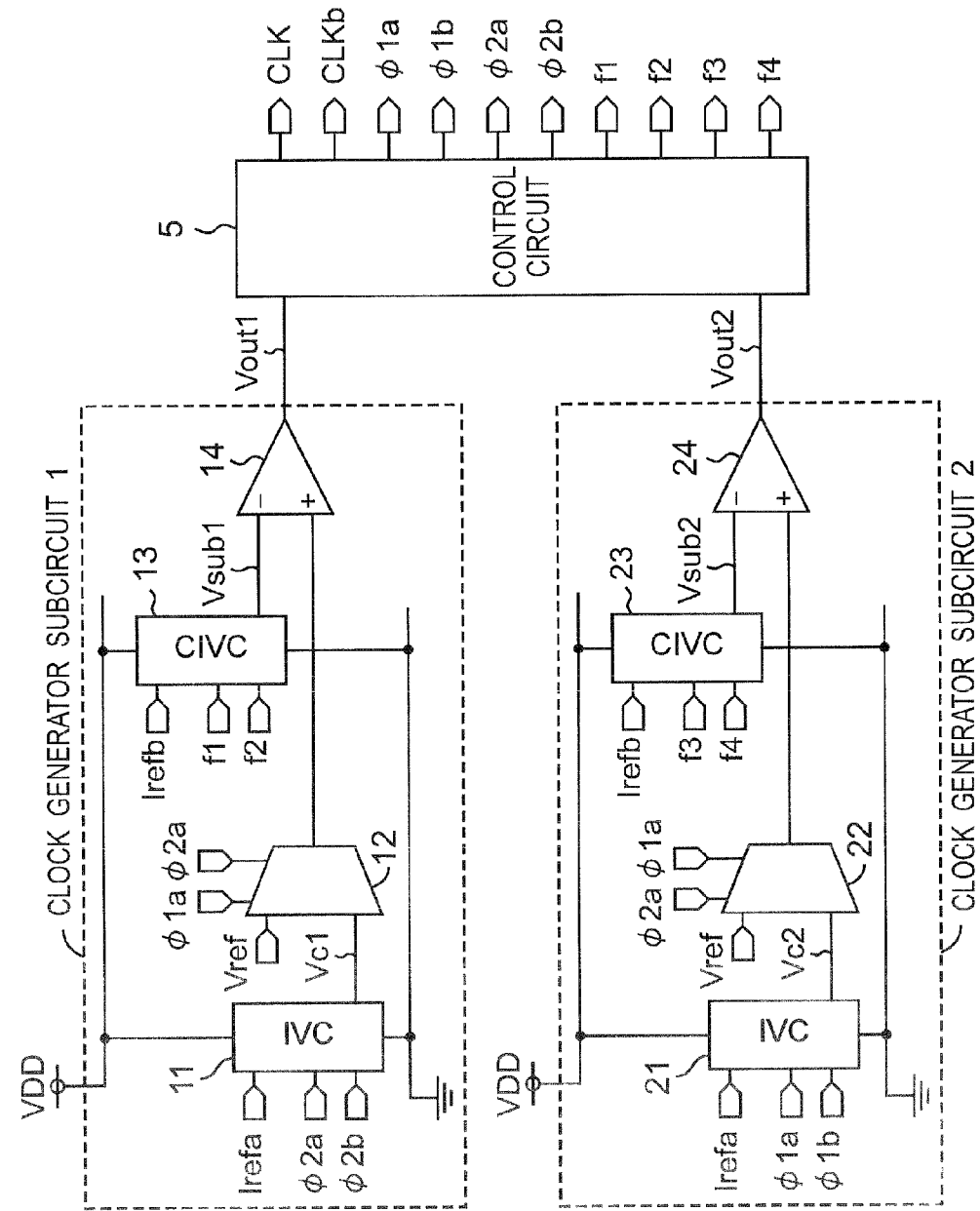
FIG. 1 is a block diagram showing a configuration of a clock generator circuit 100 according to a first preferred embodiment of the present invention.
Figure 2:
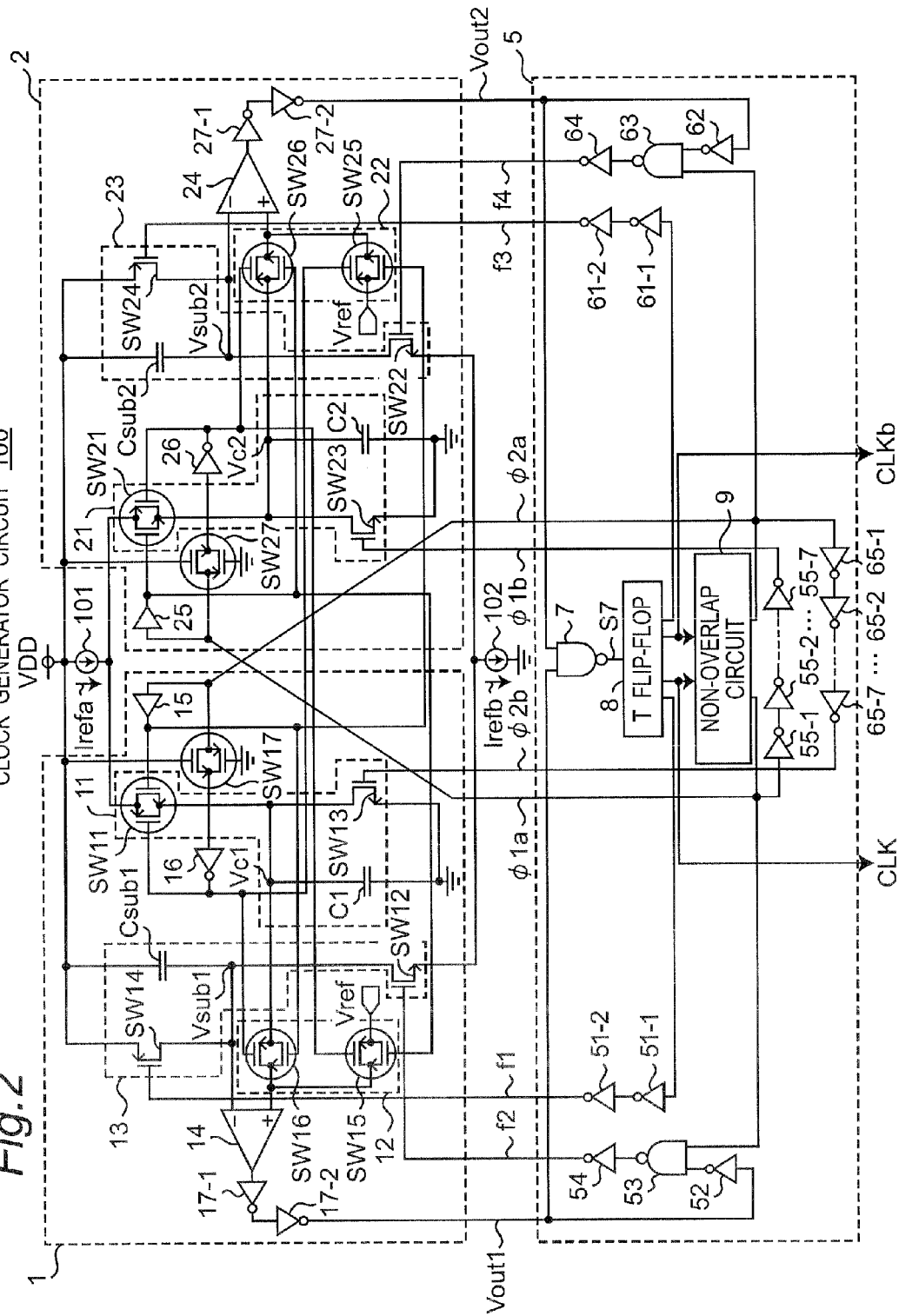
FIG. 2 is a circuit diagram showing a configuration of the clock generator circuit 100 of FIG. 1.
Figure 3:
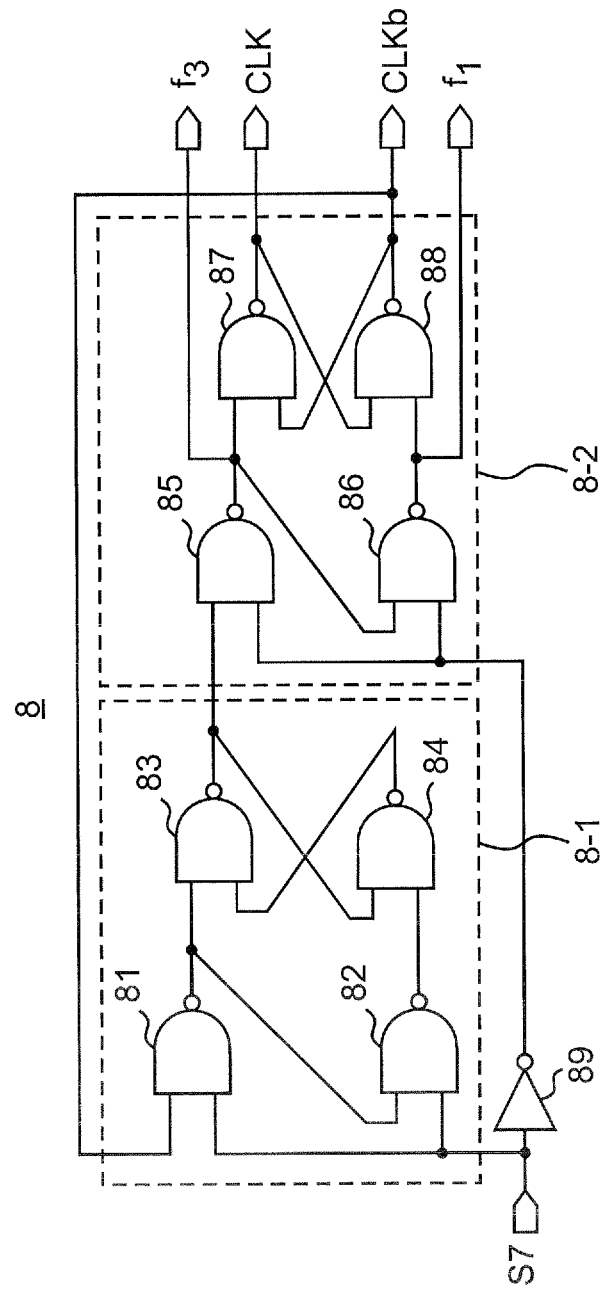
FIG. 3 is a circuit diagram showing a configuration of a T flip-flop 8 of FIG. 2.
Figure 4:
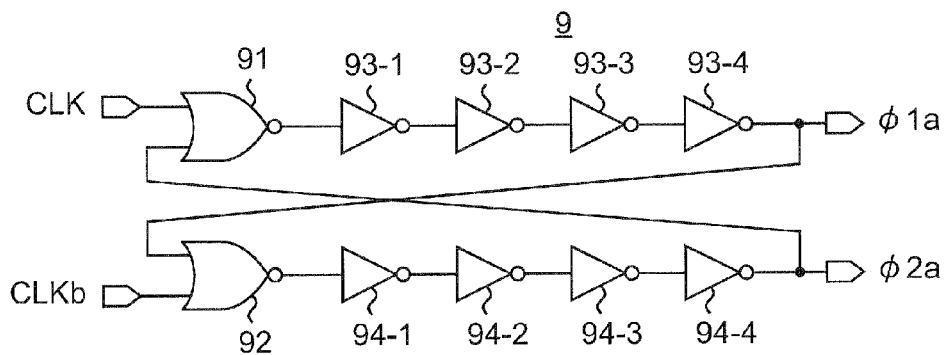
FIG. 4 is a circuit diagram showing a configuration of a non-overlap circuit 9 of FIG. 2.

Preferred embodiments of the present disclosure will be described hereinafter with reference to the drawings. In the preferred embodiments, components similar to each other are denoted by the same reference numerals.
First Preferred Embodiment FIG. 1 is a block diagram showing a configuration of a clock generator circuit 100 according to the first preferred embodiment of the present invention, and FIG. 2 is a circuit diagram showing a configuration of the clock generator circuit 100 of FIG. 1. In addition, FIG. 3 is a circuit diagram showing a configuration of a T flip-flop 8 of FIG. 2, and FIG. 4 is a circuit diagram showing a configuration of a non-overlap circuit 9 of FIG. 2.

Referring to FIG. 1, the clock generator circuit 100 is a relaxation oscillator circuit, and is configured to include clock generator subcircuits 1 and 2, and a control circuit 5. In addition, the clock generator subcircuit 1 is configured to include a current-voltage converter circuit (I-V converter (IVC)) 11, a multiplexer 12, a complementary current-voltage converter circuit (complementary I-V converter (CIVC)) 13, and a comparator 14. The complementary current-voltage converter circuit 13 has a configuration complementary to that of the current-voltage converter circuit 11. Further, the clock generator subcircuit 2 is configured to include a current-voltage converter circuit 21, a multiplexer 22, a complementary current-voltage converter circuit 23, and a comparator 24, and is configured in a manner similar to that of the clock generator subcircuit 1. The complementary current-voltage converter circuit 23 has a configuration complementary to that of the current-voltage converter circuit 21. Still further, the control circuit 5 generates a clock CLK, an inverted clock CLKb, and control signals $\phi 1a$, $\phi 1b$, $\phi 2a$, $\phi 2b$, f1, f2, f3 and f4, as described later in detail, based on an output signal Vout1 from the comparator 14 and an output signal Vout2 from the comparator 24.

As shown in FIG. 2, the clock generator subcircuit 1 further includes a buffer 15, a switch SW17 which is a Complementary Metal Oxide Semiconductor switch (referred to as a CMOS switch hereinafter) including one pair of pMOS transistor and nMOS transistor, and inverters 16, 17-1 and 17-2. In addition, the clock generator subcircuit 2 further includes a buffer 25, a switch SW27 which is a CMOS switch, and inverters 26, 27-1 and 27-2 which are not shown in FIG. 1 and the subsequent circuit diagrams. It is noted that these components 15, 16, 17-1, 17-2, 26, 27-1, 27-2, SW17 and SW27 are not shown in FIG. 1 and the subsequent circuit diagrams.

As shown in FIG. 2, the current-voltage converter circuit 11 is configured to include a switch SW11 which is a CMOS switch, a switch SW13 which is an nMOS transistor, and a capacitor C1. In this case, the capacitor C1 has a grounded first electrode and a second electrode. In addition, the switch SW11 is connected between the second electrode of the capacitor C1 and a current source 101 that outputs a predetermined constant current Irefa, and switches over between charging the capacitor C1 with the constant current Irefa and not charging the capacitor C1. Further, the switch SW13 is connected in parallel with the capacitor C1. The current-voltage converter circuit 11 outputs a voltage across both of the terminals of the capacitor C1 as an output voltage Vc1 to the multiplexer 12.

In addition, referring to FIG. 2, the complementary current-voltage converter circuit 13 is configured to include a switch SW12 which is an nMOS transistor, a switch SW14 which is a pMOS transistor, and a capacitor Csub1. In this case, the capacitor Csub1 has a first electrode connected to a power source that outputs a predetermined power voltage VDD, and a second electrode. In addition, the switch SW12 is connected between the second electrode of the capacitor and a current source 102 that outputs a predetermined constant current Irefb. The switch SW12 switches over between discharging the capacitor Csub1 with the constant current Irefb and not discharging the capacitor Csub1. Further, the switch SW14 is connected in parallel with the capacitor Csub1. The complementary current-voltage converter circuit 13 outputs, as an output voltage Vsub1, a voltage at a connecting point between the capacitor Csub1 and the switch SW12, to an inverted input terminal of the comparator 14.

Further, the multiplexer 12 is configured to include switches SW15 and SW16, each of which is a CMOS switch. The multiplexer 12 outputs one voltage of a predetermined reference voltage Vref and the output voltage Vc1 from the current-voltage converter circuit 11 to a non-inverted input terminal of the comparator 14. Then, an output signal from the comparator 14 is outputted as the output signal Vout1 to the control circuit 5 via the inverters 17-1 and 17-2.

Further, referring to FIG. 2, the current-voltage converter circuit 21 is configured to include a switch SW21 which is a CMOS switch, a switch SW23 which is an nMOS transistor, and a capacitor C2 in a manner to that of to the current-voltage converter circuit 11, generates an output voltage Vc2, and outputs the same voltage to the multiplexer 22. In addition, the complementary current-voltage converter circuit 23 is configured to include a switch SW22 which is an nMOS transistor, a switch SW24 which is a pMOS transistor, and a capacitor Csub2 in a manner similar to that of the complementary current-voltage converter circuit 13, generates an output voltage Vsub2, and outputs the same voltage to an inverted input terminal of the comparator 24. Further, the multiplexer 22 is configured to include switches SW25 and SW26 that are CMOS switches in a manner similar to that of the multiplexer 12, and outputs the reference voltage Vref or the output voltage Vc2 to a non-inverted input terminal of the comparator 24. An output signal from the comparator 24 is outputted as the output signal Vout2 to the control circuit 5 via the inverters 27-1 and 27-2.

Referring to FIG. 2, the control signal φ1a is outputted to the switch SW27, and is outputted to the switches SW15 and SW21 via the buffer 25. In this case, the switch SW27 is turned on while the clock generator circuit 100 is operating. An inverted signal of the control signal φ1a is generated by the switch SW27 and the inverter 26, and the inverted signal is outputted to the switches SW21, SW26 and SW15. Therefore, the switches SW15, SW21 and SW26 are turned on in response to the control signal φ1a having a high-level, and are turned off in response to the control signal φ1a having a low-level. In addition, the control signal φ2a is outputted to the switch SW17, and is outputted to the switch SW25, the switch SW11 and the switch SW16 via the buffer 15. In this case, the switch SW17 is turned on while the clock generator circuit 100 is operating. An inverted signal of the control signal φ2a is generated by the switch SW17 and the inverter 16, and the inverted signal is outputted to the switches SW11, SW16 and SW25. Therefore, the switches SW25, SW11 and SW16 are turned on in response to the control signal φ2a having the high-level, and are turned off in response to the control signal φ2a having the low-level.

Further, referring to FIG. 2, the control signal f1 is outputted to the switch SW14. Therefore, the switch SW14 is turned on in response to the control signal f1 having the low-level, and is turned off in response to the control signal f1 having the high-level. In addition, the control signal f2 is outputted to the switch SW12. Therefore, the switch SW12 is turned on in response to the control signal f2 having the high-level, and is turned off in response to the control signal f2 having the low-level. The control signal f3 is outputted to the switch SW24. Therefore, the switch SW24 is turned on in response to the control signal f3 having the low-level, and is turned off in response to the control signal f3 having the high-level. In addition, the control signal f4 is outputted to the switch SW22. Therefore, the switch SW22 is turned on in response to the control signal f4 having the high-level, and is turned off in response to the control signal f4 having the low-level.

It is noted in FIG. 2 that the current values of the constant current Irefa and the constant current Irefb are set to substantially the same current value Iref as each other. In addition, the capacitances of the capacitors C1, C2, Csub1 and Csub2 are set to substantially the same capacitance C as each other.

The operation of the clock generator subcircuit 1 is described next with reference to FIGS. 5 to 9. Referring to FIGS. 5 to 8, it is noted that an error voltage ΔV1 of the comparator 14 is indicated by a voltage source 120 that is connected to the non-inverted input terminal of the comparator 14 and outputs the error voltage ΔV1. In this case, the error voltage ΔV1 is due to the offset voltage and the delay of the comparator 14 caused by process variations. The clock generator subcircuit 1 operates so as to alternately repeat processes of a comparison voltage generating interval and a clock generating interval described below according to the control signals φ1a, φ2a, φ2b, f1 and f2 from the control circuit 5. Further, the comparison voltage generating interval includes a reset interval, an error voltage detecting interval, and a comparison voltage holding interval.

(1) Reset Interval in Comparison Voltage Generating Interval

Figure 5:
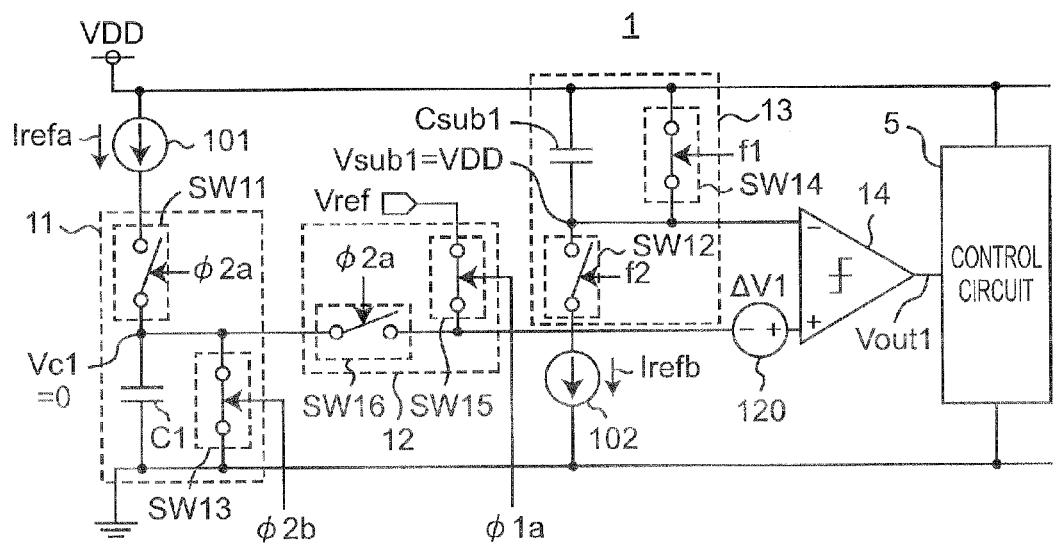
FIG. 5 is a circuit diagram showing a configuration of a clock generator subcircuit 1 of FIG. 1 for a reset interval in a comparison voltage generating interval.

FIG. 5 is a circuit diagram showing a configuration of the clock generator subcircuit 1 of FIG. 1 for the reset interval in the comparison voltage generating interval. As shown in FIG. 5, the control circuit 5 controls the clock generator subcircuit 1 to turn on the switches SW13, SW14 and SW15, and to turn off the switches SW11, SW12 and SW16 for the reset interval. Therefore, the second electrode of the capacitor C1 is grounded and charging of the capacitor C1 is inhibited, and therefore, the output voltage Vc1 from the current-voltage converter circuit 11 is reset to zero. In addition, the second electrode of the capacitor Csub1 is connected to the power source and discharging of the capacitor Csub1 is inhibited, and therefore, the output voltage Vsub1 from the complementary current-voltage converter circuit 13 is reset to the power voltage VDD. Further, the multiplexer 12 outputs the reference voltage Vref to the non-inverted input terminal of the comparator 14. It is noted that the voltage upon resetting the output voltage Vsub1 is referred to as a reset voltage.

(2) Error Voltage Detecting Interval in Comparison Voltage Generating Interval

Figure 6:
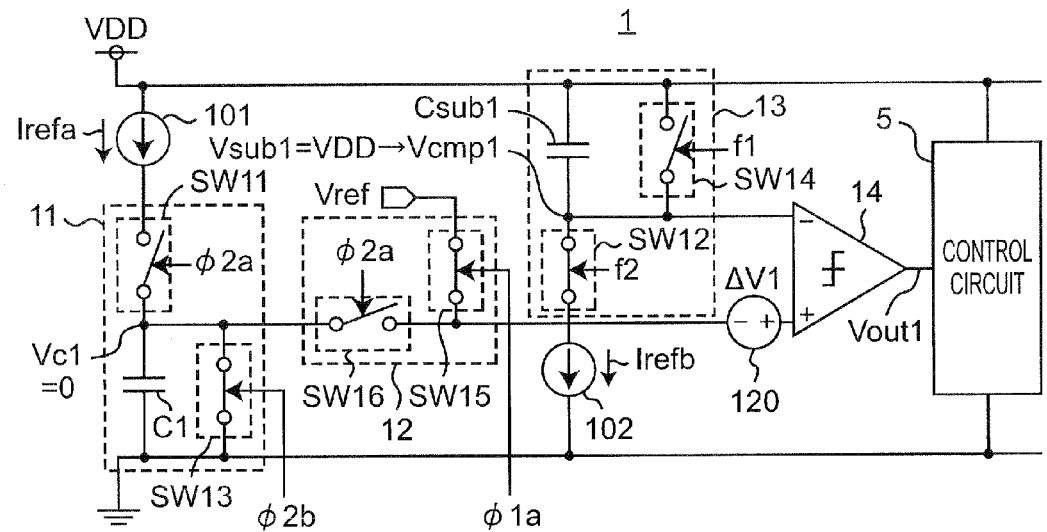
FIG. 6 is a circuit diagram showing a configuration of the clock generator subcircuit 1 of FIG. 1 for an error voltage detecting interval in the comparison voltage generating interval.

FIG. 6 is a circuit diagram showing a configuration of the clock generator subcircuit 1 of FIG. 1 for the error voltage detecting interval in the comparison voltage generating interval. As shown in FIG. 6, after the reset interval ends, the control circuit 5 controls the clock generator subcircuit 1 of FIG. 1 to turn on the switches SW12, SW13 and SW15, and to turn off the switches SW11, SW14 and SW16 for the error voltage detecting interval. The multiplexer 12 continuously outputs the reference voltage Vref to the non-inverted input terminal of the comparator 14. On the other hand, since the switch SW12 is turned on and the switch SW14 is turned off, the capacitor Csub1 is discharged with the constant current Irefb. With this discharge, electric charges are extracted from the capacitor Csub1 by the current source 102, and the output voltage Vsub1 decreases from the power voltage VDD.

Referring to FIG. 6, if the comparator 14 is an ideal comparator that does not have an offset voltage, a delay and the like, the voltage level of the output voltage Vout1 from the comparator 14 changes from the low-level to the high-level, when the output signal Vout1 coincides with the reference voltage Vref during the error voltage detecting interval. However, the comparator 14 actually has an offset voltage and a delay time caused by the variations in the manufacturing processes. Therefore, the voltage Vsub1 when the voltage level of the output signal Vout1 actually changes becomes (Vref−ΔV1). The voltage (Vref−ΔV1) is referred to as a comparison voltage Vcmp1 hereinafter.

Figure 7:
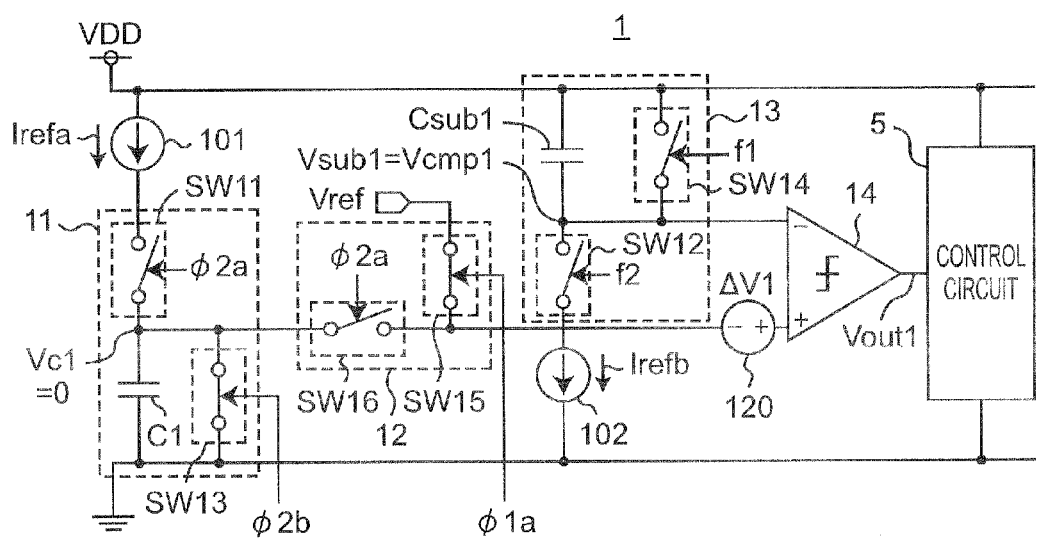
FIG. 7 is a circuit diagram showing a configuration of the clock generator subcircuit 1 of FIG. 1 for a comparison voltage holding interval in the comparison voltage generating interval.

(3) Comparison Voltage Holding Interval in Comparison Voltage Generating Interval FIG. 7 is a circuit diagram showing a configuration of the clock generator subcircuit 1 of FIG. 1 for the comparison voltage holding interval in the comparison voltage generating interval. Upon detecting that the voltage level of the output signal Vout1 has changed from the low-level to the high-level during the above-described error voltage detecting interval, the control circuit 5 controls the clock generator subcircuit 1 to turn on the switches SW13 and SW15, and to turn off the switches SW11, SW12, SW14 and SW16 as shown in FIG. 7. The multiplexer 12 continuously outputs the reference voltage Vref to the non-inverted input terminal of the comparator 14. In addition, the switch SW12 is turned off, and therefore, the discharging of the capacitor Csub1 is inhibited. Then, the capacitor Csub1 stores and holds the output voltage Vsub1 at the timing of change of the voltage level of the output signal Vout1 from the low-level to the high-level as the comparison voltage Vcmp1 of the comparator 14. In this case, the comparison voltage Vcmp1 changes depending on the delay and the value of the offset voltage of the comparator 14 relative to the reference voltage Vref. Namely, the comparison voltage Vcmp1 includes the reference voltage Vref and the error voltage $\Delta V1$, which includes the information of the nonideal characteristic (also referred to as a nonideal factor hereinafter) of the comparator 14 due to process variations thereof.

(4) Clock Generating Interval

Figure 8:
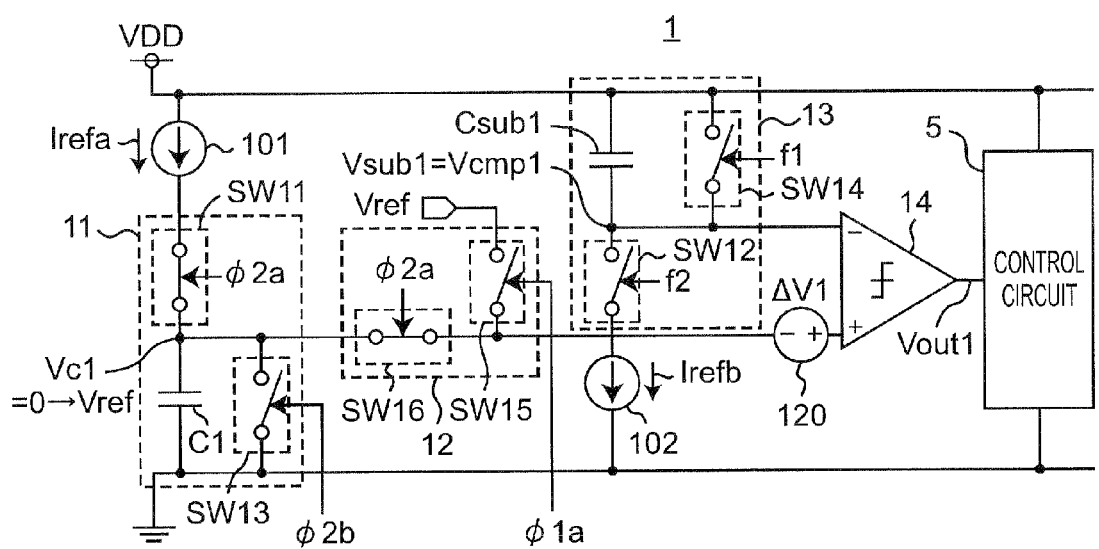
FIG. 8 is a circuit diagram showing a configuration of the clock generator subcircuit 1 of FIG. 1 for a clock generating interval.

FIG. 8 is a circuit diagram showing a configuration of the clock generator subcircuit 1 of FIG. 1 for the clock generating interval. As shown in FIG. 8, the control circuit 5 controls the clock generator subcircuit 1 to turn on the switches SW11 and SW16, and to turn off the switches SW12, SW13, SW14 and SW15 for the clock generating interval. Therefore, the multiplexer 12 outputs the output voltage Vc1 to the non-inverted input terminal of the comparator 14. Further, the capacitor C1 is connected to the current source 101, and therefore, the capacitor C1 is charged with the constant current Irefa.

During the clock generating interval, the output voltage Vc1 from the current-voltage converter circuit 11 rises from 0 V. In this case, the comparator 14 has the error voltage $\Delta V1$. Therefore, the voltage level of the output signal Vout1 from the comparator 14 changes from the low-level to the high-level when the output voltage Vc1 coincides not with the comparison voltage Vcmp1 but with the reference voltage Vref (=Vcmp1+$\Delta V1$) in a manner similar to that of the above-described error voltage detecting interval. Namely, the error voltage $\Delta V1$ of the comparator 14 is cancelled for the clock generating interval. The control circuit 5 charges the capacitor C1 with the constant current Irefa until the voltage level of the output signal Vout1 from the comparator 14 is inverted.

Figure 9:
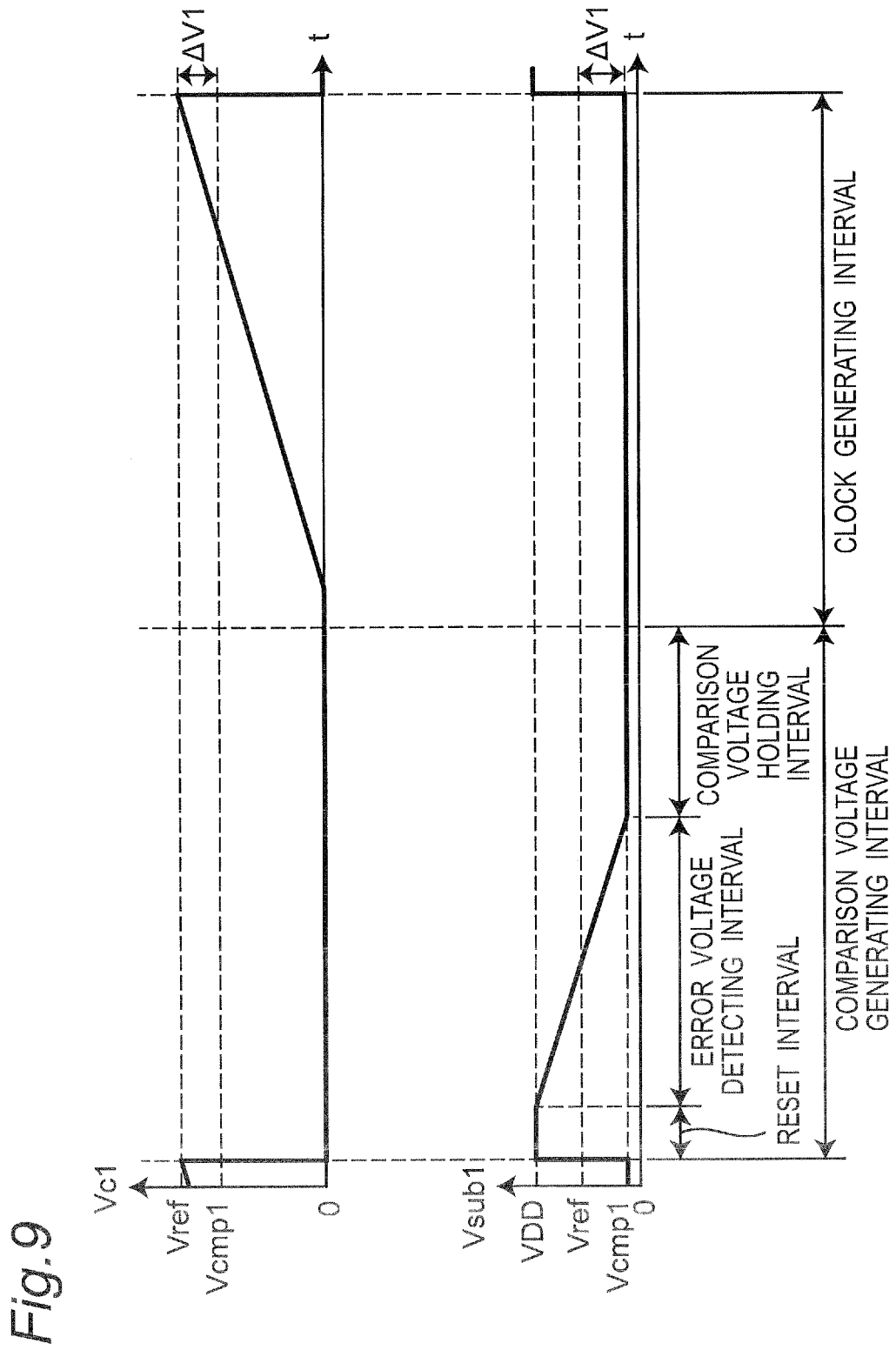
FIG. 9 is a timing chart showing a operation of the clock generator subcircuit 1 of FIG. 2.

FIG. 9 is a timing chart showing a operation of the clock generator subcircuit 1 of FIG. 2. As shown in FIG. 9, the clock generator subcircuit 1 generates and holds the comparison voltage Vcmp1 including the reference voltage Vref and the error voltage $\Delta V1$ of the comparator 14 for the comparison voltage generating interval. Then, the output voltage Vc1 from the current-voltage converter circuit 11 is compared with the comparison voltage Vcmp1 during the clock generating interval. Therefore, according to the clock generator subcircuit 1, it is possible to measure time from the start timing of the clock generating interval to when the output voltage Vc1 becomes the reference voltage Vref (i.e., the substantial charging time of the capacitor C1) without the influence of the error voltage $\Delta V1$ of the comparator 14. Namely, it is possible to control the output signal Vout1 from the comparator 14 for the clock generating interval by the reference voltage Vref without the influence of the non-ideal characteristics of the comparator 14 due to the process variations, and therefore, it is possible to realize the operation equivalent to the operation when the comparator 14 executes an ideal operation.

As shown in FIGS. 1 and 2, in the clock generator subcircuit 2, the current-voltage converter circuit 21 operates according to the control signals 41a and φ1b to generate the output voltage Vc2 and output the same signal to the multiplexer 22, in a manner similar to that of the current-voltage converter circuit 11. In addition, the multiplexer 22 operates according to the control signals φ2a and φ1a to output the reference voltage Vref or the output voltage Vc2 to the non-inverted input terminal of the comparator 24, in a manner similar to that of the multiplexer 12. Further, the complementary current-voltage converter circuit 23 operates according to the control signals f3 and f4 to generate the output voltage Vsub2 and output the same signal to the inverted input terminal of the comparator 24, in a manner similar to that of the complementary current-voltage converter circuit 23. The output signal Vout2 from the comparator 24 is outputted to the control circuit 5. The output signal Vout2 in the comparison voltage holding mode of the clock generator subcircuit 2 is referred to as a comparison voltage Vcmp2 hereinafter. In this case, the comparison voltage Vcmp2 includes the reference voltage Vref and an error voltage $\Delta V2$ of the comparator 24.

The control circuit 5 controls the clock generator subcircuit 1 to alternately repeat the processes of the comparison voltage generating interval and the clock generating interval. In this case, the clock generator subcircuit 1 cannot measure the above-described charging time of the capacitor C1 for the comparison voltage generating interval. Therefore, if the clock generator circuit 100 includes only the clock generator subcircuit 1 and the control circuit 5, then the charging time of the capacitor C1 necessary for the relaxation oscillating operation cannot be measured for the comparison voltage generating interval of the clock generator subcircuit 1. Therefore, in the present preferred embodiment, the control circuit 5 controls the clock generator subcircuits 1 and 2 so that one subcircuit of the clock generator subcircuits 1 and 2 operates for the comparison voltage generating interval, then another subcircuit operates for the clock generating interval. Namely, the control circuit 5 controls the clock generator subcircuits 1 and 2 to operate complementarily. Therefore, the clock generator subcircuits 1 and 2 alternately enters the clock generating interval, and therefore, the clock generator circuit 100 executes the relaxation oscillating operation as a whole, allowing the clock to be continuously generated.

A configuration and an operation of the control circuit 5 are concretely described next. Referring to FIG. 2, the control circuit 5 is configured to include a NAND gate 7, the T flip-flop 8, a non-overlap circuit 9, cascade-connected inverters 55-1 to 55-7, cascade-connected inverters 65-1 to 65-7, cascade-connected inverters 51-1 and 51-2, cascade-connected inverters 61-1 and 61-2, NAND gates 53 and 63, and inverters 52, 54, 62 and 64. The output signals Vout1 and Vout2 from the clock generator subcircuits 1 and 2 are outputted to the NAND gate 7, and an output signal S7 from the NAND gate 7 is outputted to the T flip-flop 8.

Referring to FIG. 3, the T flip-flop 8 has a configuration similar to that of a master-slave pulse-triggered D flip-flop described in the Non-Patent Document 3, for example. The T flip-flop 8 is configured to include two D latches 8-1 and 8-2 connected in series, and an inverter 89. In addition, the D latch 8-1 is configured to include NAND gates 81 to 84, and the D latch 8-2 is configured to include NAND gates 85 to 88. In this case, first and second input terminals of the NAND gate 81 correspond to a data input terminal and an enable terminal of the D latch 8-1, respectively. An output terminal of the NAND gate 83 corresponds to a non-inverted output terminal of the D latch 8-1. In addition, the first and second input terminals of the NAND gate 85 correspond to a data input terminal and an enable terminal of the D latch 8-2, respectively. An output terminal of the NAND gate 87 corresponds to a non-inverted output terminal of the D latch 8-2, and an output terminal of the NAND gate 88 corresponds to an inverted output terminal of the D latch 8-2.

Referring to FIG. 3, the output signal S7 from the NAND gate 7 is outputted to the enable terminal of the D latch 8-1, and is outputted to the enable terminal of the D latch 8-2 via the inverter 89. In addition, an output signal from the D latch 8-1 is outputted to the data input terminal of the D latch 8-2. Further, an output signal from the non-inverted output terminal of the D latch 8-2 is outputted as the clock CLK to the non-overlap circuit 9 and an external circuit of the clock generator circuit 100. In addition, an output signal from the inverted output terminal of the D latch 8-2 is outputted as the inverted clock CLKb to the external circuit of the clock generator circuit 100, the data input terminal of the D latch 8-1, and the non-overlap circuit 9

In addition, referring to FIG. 3, an output signal from the NAND gate 85 is outputted as the control signal f3 via the inverters 61-1 and 61-2 (See FIG. 2). An output signal from the NAND gate 86 is outputted as the control signal f1 via inverters 51-1 and 51-2 (See FIG. 2).

Referring to FIG. 4, the non-overlap circuit 9 is configured to include NOR gates 91 and 92, cascade-connected inverter 93-1 to 93-4, and cascade-connected inverters 94-1 to 94-4. In this case, the clock CLK is outputted to a first input terminal of the NOR gate 91, while the inverted clock CLKb is outputted to a first input terminal of the NOR gate 92. In addition, an output signal from the NOR gate 91 is outputted as the control signal ϕ1a from the control circuit 5 via the inverters 93-1 to 93-4, and outputted to a second input terminal of the NOR gate 92. Further, an output signal from the NOR gate 92 is outputted as the control signal ϕ2a from the control circuit 5 via the inverters 94-1 to 94-4, and outputted to a second input terminal of the NOR gate 91.

Referring to FIG. 2, the control signal ϕ1a is delayed and inverted by the inverters 55-1 to 55-7, and is outputted as the control signal ϕ1b from the control circuit 5. In addition, the control signal ϕ2a is delayed and inverted by the inverters 65-1 to 65-7, and is outputted as the control signal ϕ2b from the control circuit 5.

Further, referring to FIG. 2, the output signal Vout1 from the clock generator subcircuit 1 is inputted to a first input terminal of the NAND gate 53 via the inverter 52, and the control signal ϕ1a is inputted to a second input terminal of the NAND gate 53. Then, an output signal from the NAND gate 53 is outputted as the control signal f2 from the control circuit 5 via the inverter 54. In addition, the output signal Vout2 from the clock generator subcircuit 2 is inputted to a first input terminal of the NAND gate 63 via the inverter 62, and the control signal ϕ2a is inputted to a second input terminal of the NAND gate 63. Then, an output signal from the NAND gate 63 is outputted as the control signal f4 from the control circuit 5 via the inverter 64.

Figure 10:
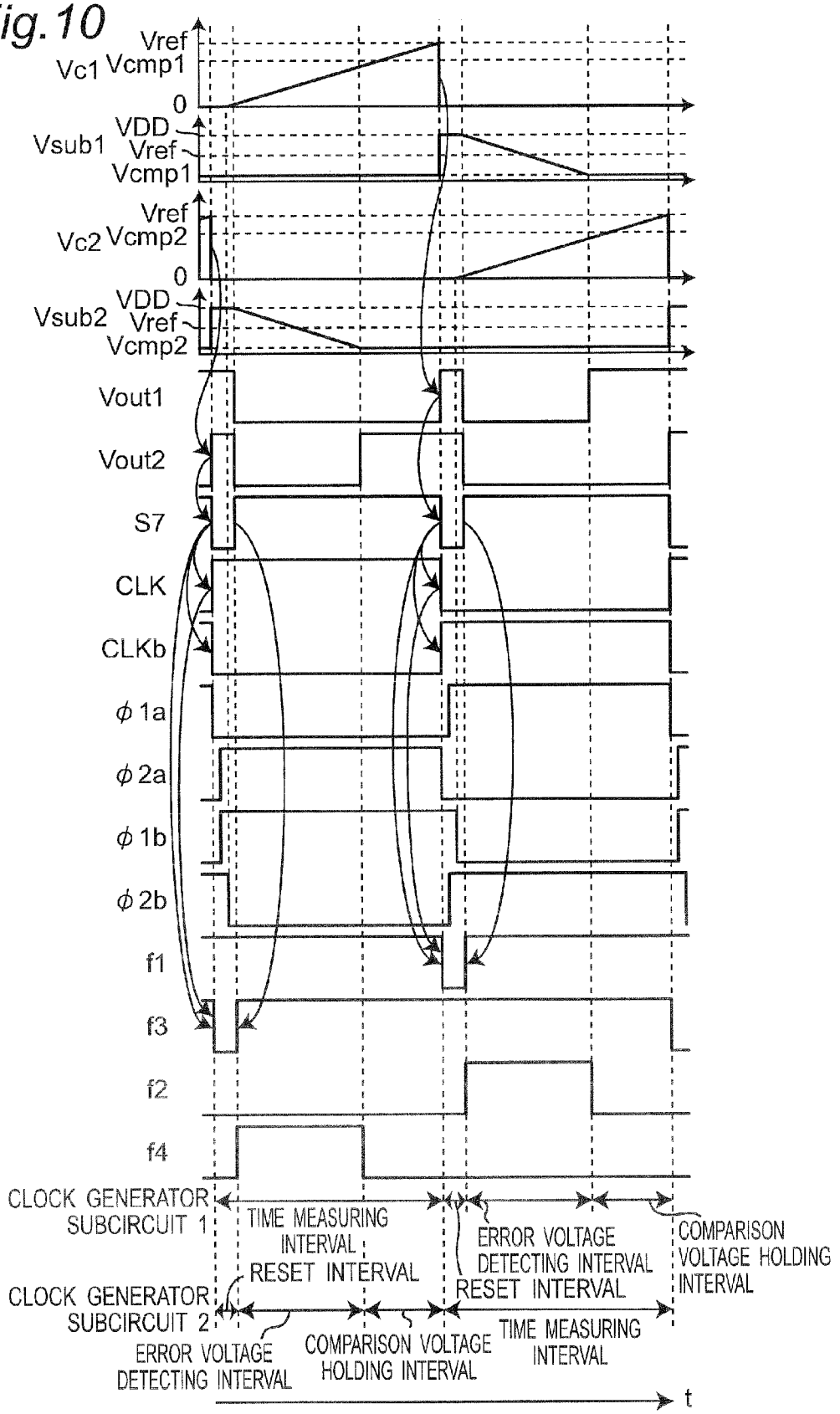
FIG. 10 is a timing chart showing a operation of the clock generator circuit 100 of FIG. 2.

The operation of the control circuit 5 configured as described above is described. FIG. 10 is a timing chart showing the operation of the clock generator circuit 100 of FIG. 2. As shown in FIG. 10, the clock CLK and the control signals ϕ1a, ϕ1b, ϕ2a, ϕ2b, f1, f2, f3 and f4 are generated as follows based on the output signals Vout1 and Vout2 from the clock generator subcircuits 1 and 2.

(1) Clock CLK

As shown in FIG. 10, when one of the clock generator subcircuits 1 and 2 operates for the comparison voltage holding interval (i.e., when the voltage level of the output signal Vout1 or Vout2 from the circuit operating for the comparison voltage holding interval is the high-level), the T flip-flop 8 detects the rising edge of the output signal Vout2 or Vout1 from another subcircuit based on the output signal S7 from the NAND gate 7. Then, the T flip-flop 8 inverts the voltage level of the clock CLK from the high-level to the low-level or from the low-level to the high-level, at a timing of a detected rising edge.

(2) Control Signals ϕ1A, ϕ2A, ϕ1B and ϕ2B

As shown in FIG. 10, the non-overlap circuit 9 generates the control signal ϕ1a that falls at falling timings of the inverted clock CLKb and rises at timings delayed by a predetermined delay time from rising timings of the inverted clock CLKb, based on the clock CLK and the inverted clock CLKb. In addition, the non-overlap circuit 9 generates the control signal ϕ2a that falls at falling timings of the clock CLK and rises at timings delayed by a predetermined delay time from rising timings of the clock CLK, based on the clock CLK and the inverted clock CLKb. Further, the control circuit 5 generates the control signal ϕ1b by delaying and inverting the control signal ϕ1a, and generates the control signal ϕ2b by delaying and inverting the control signal ϕ2a.

The control signals ϕ1a and ϕ2a represent switching over timing between the clock generating interval and the comparison voltage generating interval in the clock generator subcircuits 1 and 2, respectively. In addition, the control signal ϕ1b represents the charging start timing of the capacitor C2 in the clock generator subcircuit 2, and the control signal ϕ2b represents the charging start timing of the capacitor C1 in the clock generator subcircuit 1.

(3) Control Signals f1 and f3

As shown in FIG. 10, upon detecting the falling edge of the clock CLK based on the output signal S7 from the NAND gate 7 when the voltage levels of the output signals Vout1 and Vout2 from the clock generator subcircuits 1 and 2 are the high-level, the T flip-flop 8 generates the control signal f1 having the low-level. In addition, upon detecting the rising edge of the clock CLK based on the output signal S7 from the NAND gate 7 when the voltage levels of the output signals Vout1 and Vout2 from the clock generator subcircuits 1 and 2 are the high-level, the T flip-flop 8 generates the control signal f3 having the low-level. The control signal f1 represents the reset interval during which the output voltage Vsub1 is reset to the power voltage VDD in the clock generator subcircuit 1, and the control signal f3 represents the reset interval during which the output voltage Vsub2 is reset to the power voltage VDD in the clock generator subcircuit 2.

(4) Control Signals f2 and f4

As shown in FIG. 10, upon detecting that the voltage level of the output signal Vout1 is the low-level and the voltage level of the control signal ϕ1a is the high-level, the control circuit 5 generates the control signal f2 having the high-level. In addition, upon detecting that the voltage level of the output signal Vout2 is the low-level and the voltage level of the control signal ϕ2a is the high-level, the control circuit 5 generates the control signal f4 having the high-level. The control signal f2 represents the error voltage detecting interval of the clock generator subcircuit 1, and the control signal f4 represents the error voltage detecting interval of the clock generator subcircuit 2.

In order to normally operate the clock generator circuit 100 of the present preferred embodiment, while one of the clock generator subcircuits 1 and 2 operates for the clock generating interval, another subcircuit needs to end the error voltage detecting interval and stand by in the comparison voltage holding interval. Namely, the duration of the clock generating interval of one circuit of the clock generator subcircuits 1 and 2 needs to be longer than the duration of the error voltage detecting interval of another subcircuit. Therefore, when the current value of each of the constant current Irefa and the constant current Irefb is set to the current value Iref, and the capacitance of each of the capacitors C1, C2, Csub1 and Csub2 is set to the capacitance C, the following equation needs to hold:

$$\frac{C \cdot Vref}{Iref} > \frac{C(VDD - Vref)}{Iref}. \quad (1)$$

The Equation (1) is changed the following equation:

$$Vref > \tfrac{1}{2} \cdot VDD \quad (2).$$

As described above, the clock generator circuit 100 of the present preferred embodiment is configured to include the clock generator subcircuit 1, the clock generator subcircuit 2 configured in a manner similar to that of the clock generator subcircuit 1, and the control circuit 5. The clock generator subcircuit 1 generates the comparison voltage Vcmp1 that includes the reference voltage Vref and the error voltage ΔV1 of the comparator 14 for the comparison voltage generating interval, and compares the cross terminal voltage Vc1 of the capacitor C1 upon charging the capacitor C1 with the comparison voltage Vcmp1 for the clock generating interval. The control circuit 5 controls the clock generator subcircuits 1 and 2 so that one subcircuit of the clock generator subcircuits 1 and 2 operates for the comparison voltage generating interval, then another subcircuit operates for the clock generating interval. Therefore, the clock CLK having a constant frequency can be generated without the influence of the delays and the offset voltages of the comparators 14 and 24. In addition, since no resistor needs to be used, the circuit size can be reduced as compared with that of the relaxation oscillator circuit described in the Non-Patent Document 2.

It is noted that the power consumption of the clock generator circuit 100 can be reduced by using a current source that outputs smaller constant currents Irefa and Irefb as the current sources 101 and 102.

Modified Preferred Embodiment of First Preferred Embodiment

Figure 11:
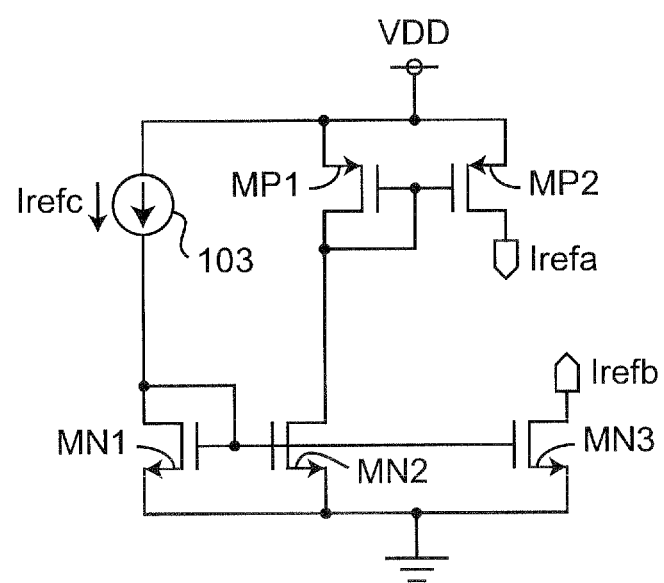
FIG. 11 is a circuit diagram showing a configuration a current generating circuit according to a modified preferred embodiment of the first preferred embodiment of the present invention.

FIG. 11 is a circuit diagram showing a configuration of a current generating circuit according to a modified preferred embodiment of the first preferred embodiment of the present invention. The constant currents Irefa and Irefb are generated by using two current sources 101 and 102, respectively, in the first preferred embodiment, however, the present invention is not limited to this. The constant currents Irefa and Irefb may be generated by using the current generating circuit of FIG. 11. The current generating circuit of FIG. 11 is configured to include a current source 103 that generates a predetermined constant current Irefc, a current mirror circuit that includes nMOS transistors MN1, MN2 and MN3 and generates a constant current Irefb corresponding to the constant current Irefc, and a current mirror circuit that has pMOS transistors MP1 and MP2 and generates a constant current Irefa corresponding to the constant current Irefc. In this case, mirror ratios of the two current mirror circuits is set so that the current values of the constant currents Irefa and Irefb become equal to each other.

According to the present modified preferred embodiment, the number of the current sources necessary for the operation of the clock generator circuit 100 can be reduced to one. In addition, by appropriately setting the sizes of the transistors that constitute each of the current mirror circuits, the current values of the constant currents Irefa and Irefb can be controlled.

Second Preferred Embodiment

Figure 12:
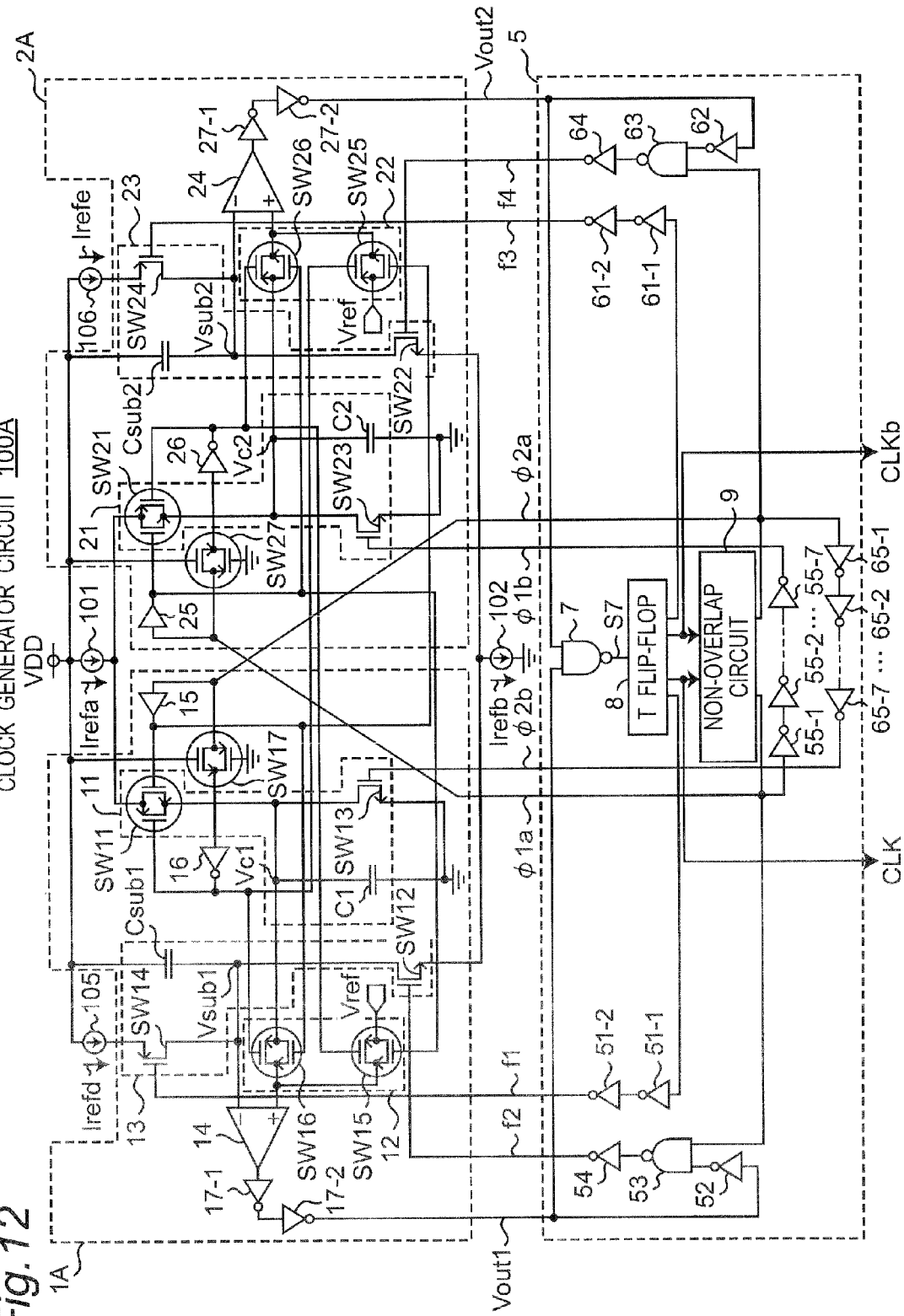
FIG. 12 is a circuit diagram showing a configuration of a clock generator circuit 100A according to a second preferred embodiment of the present invention.

FIG. 12 is a circuit diagram showing a configuration of a clock generator circuit 100A according to the second preferred embodiment of the present invention. The clock generator circuit 100A of FIG. 12 is different from the clock generator circuit 100 of FIG. 2 in the point that current generator subcircuits 1A and 2A are provided instead of the current generator subcircuits 1 and 2, respectively.

In the first preferred embodiment (See FIG. 2), the switch SW14 of the current generator subcircuit 1 is connected in parallel with the capacitor Csub1, which has the first electrode grounded via the switch SW12 and the second electrode connected to the power source VDD. In contrast to this, a current source 105 that outputs a predetermined constant current Irefd is connected between the switch SW14 and the power source VDD in the current generator subcircuit 1A of FIG. 12. Namely, the switch SW14 is connected in parallel with the capacitor Csub1 via the current source 105. The current generator subcircuit 1A is configured in a manner similar to that of the clock generator subcircuit 1 regarding the other points.

In addition, in the first preferred embodiment (See FIG. 2), the switch SW24 of the current generator subcircuit 1 is connected in parallel with the capacitor Csub2, which has the first electrode grounded via the switch SW22 and the second electrode connected to the power source VDD. In contrast to this, a current source 106 that outputs a predetermined constant current Irefe is connected between the switch SW24 and the power source VDD in the current generator subcircuit 2A of FIG. 12. Namely, the switch SW24 is connected in parallel with the capacitor Csub2 via the current source 106. The current generator subcircuit 2A is configured in a manner similar to that of the clock generator subcircuit 2 regarding the other points.

Since the current source 105 is connected in parallel with the capacitor Csub1 for the reset interval of the current generator subcircuit 1A, the output voltage Vsub1 from the complementary current-voltage converter circuit 13 is reset to a predetermined reset voltage lower than the power voltage VDD. In addition, since the current source 106 is connected in parallel with the capacitor Csub2 for the reset interval of the current generator subcircuit 2A, the output voltage Vsub2 from the complementary current-voltage converter circuit 23 is reset to a predetermined reset voltage lower than the power voltage VDD. In this case, the current values of the constant currents Irefd and Irefe are set to substantially the same current value as each other, and are set so that each of the output voltages Vsub1 and Vsub2 for the respective reset intervals becomes a voltage (Vref+Va). Therefore, the reset voltage is not the power voltage VDD but the voltage (Vref+Va), and the capacitor Csub1 is discharged from the state in which the output signal Vout1 is the voltage (Vref+Va) for the error voltage detecting interval. The capacitor Csub2 is discharged in a manner similar to that of the capacitor Csub1.

Since the output signals Vout1 and Vout2 are reset to the power voltage VDD in the first preferred embodiment, the duration of the error voltage detecting interval (the right side of the Equation (1)) depends on the power voltage VDD, and the power voltage VDD and the reference voltage Vref need to satisfy the above-described Equation (2). On the other hand, the Equation (1) is expressed by the following equation in the present preferred embodiment:

$$\frac{C \cdot Vref}{Iref} > \frac{C(Vref + Va - Vref)}{Iref}. \quad (3)$$

The Equation (3) is changed to the following equation:

$$Vref > Va \quad (4).$$

According to the present preferred embodiment, the duration of the error voltage detecting interval (the right side of the Equation (3)) does not depend on the power voltage VDD, and therefore, the restrictive condition between the power voltage VDD and the reference voltage Vref can be removed. The voltage Va should preferably be set so as to satisfy the Equation (4). Therefore, it is possible to generate the clock CLK that has a constant clock frequency without depending on the reference voltage Vref.

IMPLEMENTAL EXAMPLE

Results of executing evaluations of the clock generator circuit 100 of the first preferred embodiment and the clock generator circuit 100A of the second preferred embodiment by using simulations by SPICE (Simulation Program with Integrated Circuit Emphasis) are described next. A standard CMOS process of a 0.18-μm CMOS process was used. In addition, the power voltage VDD was set to 1.8 V, the current value Iref of each of the constant currents Irefa and Irefb was set to 100 nA, the reference voltage Vref was set to 1.2 V, and the capacitance C of each of the capacitors C1, C2, Csub1 and Csub2 was set to 3.09 pF.

Figure 16:
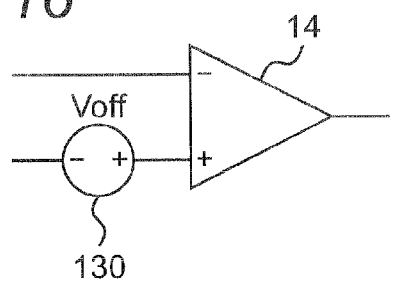
FIG. 16 is a circuit diagram showing a connection method of a voltage source 130 upon executing simulations, when a comparator 14 of FIG. 2 has an offset voltage Voff.

Further, by connecting a voltage source 130 that generates a predetermined offset voltage Voff to the non-inverted input terminal of the comparator 14 as shown in FIG. 16, a relation between the offset voltage Voff of the comparator 14 and the clock CLK was evaluated. It was assumed that the comparators 14 and 24 had the same offset voltage Voff, and the offset voltage Voff was varied within a range from −30 mV to 30 mV. Further, the Monte Carlo simulation for the clock generator circuit 100 was executed 100 times, and the variation in the frequency of the clock CLK (referred to as a clock frequency hereinafter), the temperature dependence of the clock frequency, and the power voltage dependence of the clock frequency were also evaluated.

Figure 13:
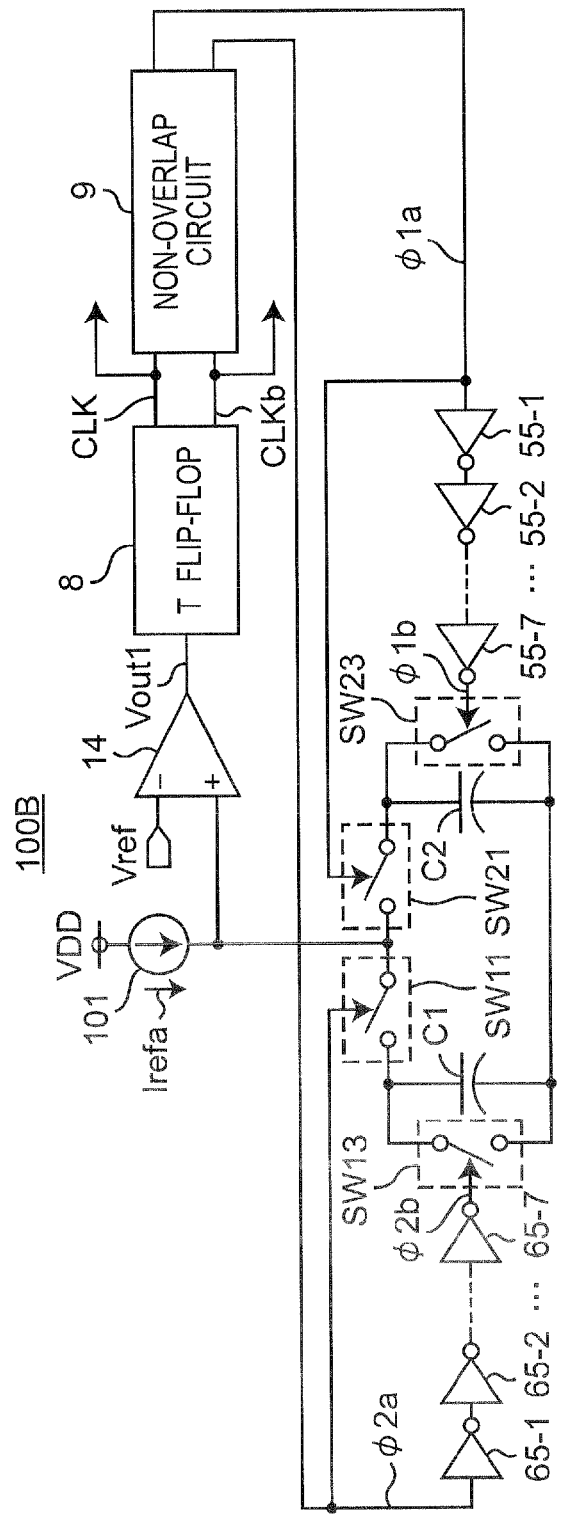
FIG. 13 is a circuit diagram showing a configuration of a clock generator circuit 100B according to a first comparative example.
Figure 14:
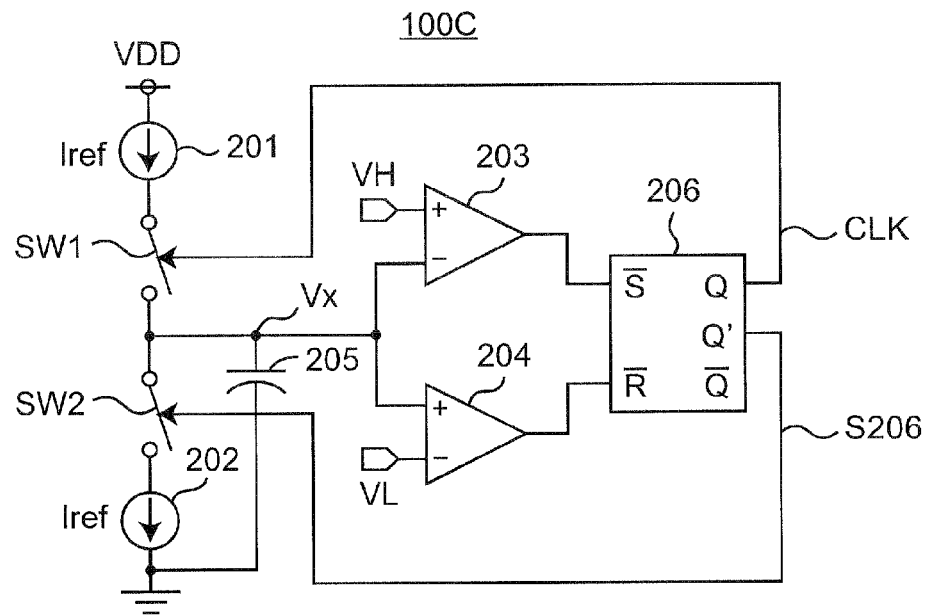
FIG. 14 is a circuit diagram showing a configuration of a clock generator circuit 100C according to a second comparative example.

In addition, a clock generator circuit 100B according to a first comparative example of FIG. 13 and a clock generator circuit 100C according to a second comparative example of FIG. 14 were also simulated in a manner similar to that of the clock generator circuit 100, and the results were compared with the simulation results of the clock generator circuit 100.

FIG. 13 is a circuit diagram showing a configuration of the clock generator circuit 100B of the first comparative example. Referring to FIG. 13, the clock generator circuit 100B is configured to include the comparator 14, the T flip-flop 8, the non-overlap circuit 9, the capacitors C1 and C2, the switches SW11, SW13, SW21 and SW23, the inverters 55-1 to 55-7, and 65-1 to 65-7. The clock generator circuit 100B is different from the clock generator circuit 100 in the point that the reference voltage Vref is used instead of the comparison voltages Vcmp1 and Vcmp2 for the clock generating interval.

Figure 15:
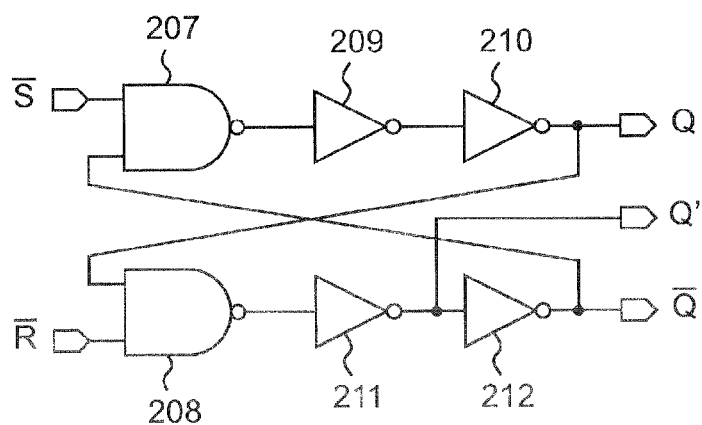
FIG. 15 is a circuit diagram showing a configuration of an RS flip-flop 206 of FIG. 14.

FIG. 14 is a circuit diagram showing a configuration of the clock generator circuit 100C of the second comparative example, and FIG. 15 is a circuit diagram showing a configuration of an RS flip-flop 206 of FIG. 14. The clock generator circuit 100C is a reference clock oscillator circuit disclosed in the Non-Patent Document 4. Referring to FIG. 14, the clock generator circuit 100O is configured to include current sources 201 and 202 each of which generates the predetermined constant current Iref, switches SW1 and SW2, a capacitor 205, comparators 203 and 204, and the RS flip-flop 206. In addition, referring to FIG. 15, the RS flip-flop 206 is configured to include NAND gates 207 and 208, and inverters 209 to 212.

Referring to FIG. 14, the comparator 204 compares a voltage Vx at a connecting point between the capacitor 205 and the switch SW2 with a predetermined reference voltage VL, and outputs an output signal that represents a comparison result to an inverted reset terminal of the RS flip-flop 206. In addition, the comparator 203 compares the voltage Vx with a predetermined reference voltage VH(>VL), and outputs an output signal that represents a comparison result to an inverted set terminal of the flip-flop 206. The RS flip-flop 206 outputs a clock CLK from the non-inverted output terminal.

In addition, referring to FIG. 14, the switches SW1 and SW2 are controlled to be turned on and off as follows according to the clock CLK and an output signal S206 from the RS flip-flop. When the voltage level of the output signal from the comparator 203 becomes the low-level from the high-level, the switch 201 is controlled to be turned off, and the switch 202 is controlled to be turned on. In response to this, the voltage level of the output signal from the comparator 203 returns to the high-level. In addition, when the voltage level of the output signal from the comparator 204 becomes the low-level from the high-level, the switch 201 is controlled to be turned on, and the switch 202 is controlled to be turned off. In response to this, the voltage level of the output signal from the comparator 204 returns to the high-level. It is noted that the voltage levels of the output signals from the comparators 203 and 204 do not simultaneously become the low-level.

Figure 17:
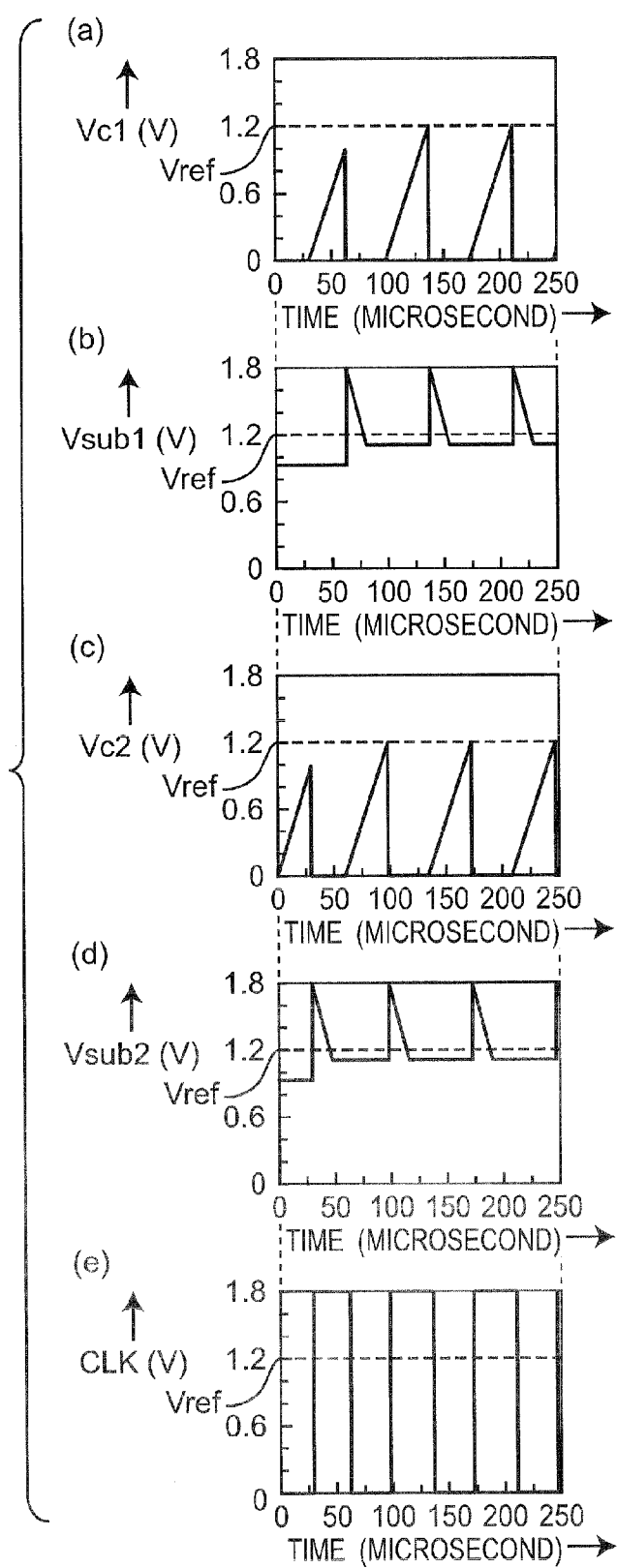
FIG. 17 shows results of simulations, when the comparators 14 and 24 have an offset voltage Voff of −30 mV in the clock generator circuit 100 of FIG. 2, where FIG. 17(*a*) is a graph of an output voltage Vc1 from a current-voltage converter circuit 11, FIG. 17(*b*) is a graph of an output voltage Vsub1 from a complementary current-voltage converter circuit 12, FIG. 17(*c*) is a graph of an output voltage Vc2 from a current-voltage converter circuit 21, FIG. 17(*d*) is a graph of an output voltage Vsub2 from a complementary current-voltage converter circuit 22, and FIG. 17(*e*) is a graph of a clock CLK from the clock generator circuit 100.
Figure 18:
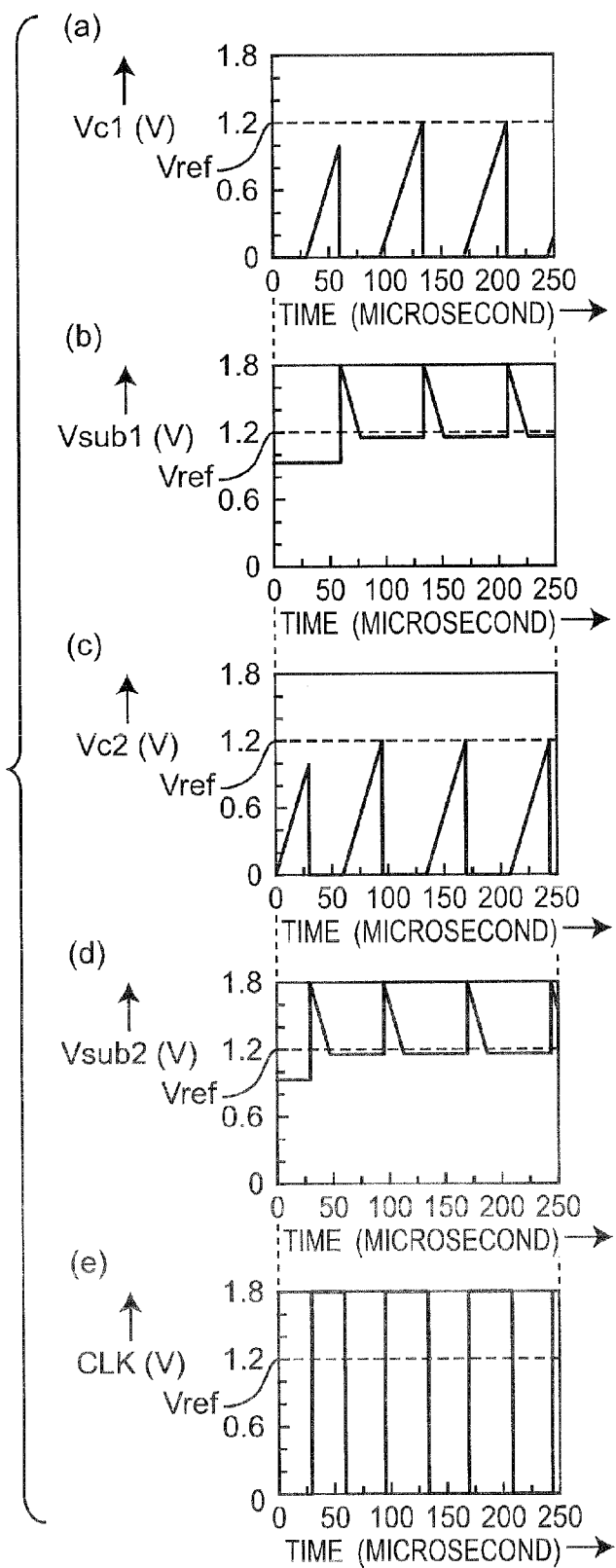
FIG. 18 shows results of simulations, when the comparators 14 and 24 have the offset voltage Voff of 0 mV in the clock generator circuit 100 of FIG. 2, where (a) is a graph of the output voltage Vc1 from the current-voltage converter circuit 11, (b) is a graph of the output voltage Vsub1 from the complementary current-voltage converter circuit 12, (c) is a graph of the output voltage Vc2 from the current-voltage converter circuit 21, (d) is a graph of the output voltage Vsub2 from the complementary current-voltage converter circuit 22, and (e) is a graph of the clock CLK from the clock generator circuit 100.

FIG. 17 shows results of simulations, when the comparators 14 and 24 have the offset voltage Voff of −30 mV in the clock generator circuit 100 of FIG. 2, where FIG. 17 (a) is a graph of the output voltage Vc1 from the current-voltage converter circuit 11, FIG. 17 (b) is a graph of the output voltage Vsub1 from the complementary current-voltage converter circuit 12, FIG. 17 (c) is a graph of the output voltage Vc2 from the current-voltage converter circuit 21, FIG. 17 (d) is a graph of the output voltage Vsub2 from the complementary current-voltage converter circuit 22, and FIG. 17 (e) is a graph of the clock CLK from the clock generator circuit 100. In addition, FIG. 18 shows results of simulations, when the comparators 14 and 24 have the offset voltage Voff of 0 mV in the clock generator circuit 100 of FIG. 2, where FIG. 18 (a) is a graph of the output voltage Vc1 from the current-voltage converter circuit 11, FIG. 18 (b) is a graph of the output voltage Vsub1 from the complementary current-voltage converter circuit 12, FIG. 18 (c) is a graph of the output voltage Vc2 from the current-voltage converter circuit 21, FIG. 18 (d) is a graph of the output voltage Vsub2 from the complementary current-voltage converter circuit 22, and FIG. 18 (e) is a graph of the clock CLK from the clock generator circuit 100. Further, FIG. 19 shows results of simulations, when the comparators 14 and 24 have the offset voltage Voff of 30 mV in the clock generator circuit 100 of FIG. 2, where FIG. 19 (a) is a graph of the output voltage Vc1 from the current-voltage converter circuit 11, FIG. 19 (b) is a graph of the output voltage Vsub1 from the complementary current-voltage converter circuit 12, FIG. 19 (c) is a graph of the output voltage Vc2 from the current-voltage converter circuit 21, FIG. 19 (d) is a graph of the output voltage Vsub2 from the complementary current-voltage converter circuit 22, and FIG. 19 (e) is a graph of the clock CLK from the clock generator circuit 100.

Figure 19:
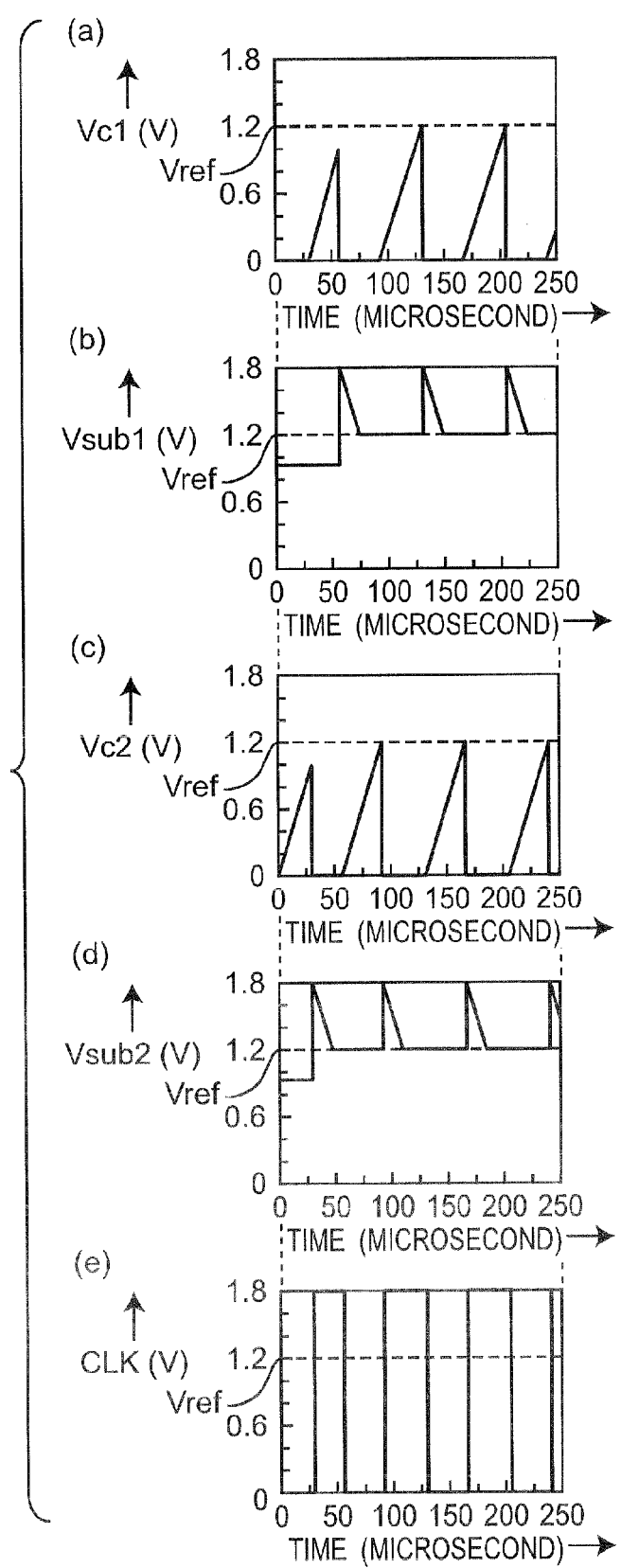
FIG. 19 shows results of simulations, when the comparators 14 and 24 have the offset voltage V off of 30 mV in the clock generator circuit 100 of FIG. 2, where (a) is a graph of the output voltage Vc1 from the current-voltage converter circuit 11, (b) is a graph of the output voltage Vsub1 from the complementary current-voltage converter circuit 12, (c) is a graph of the output voltage Vc2 from the current-voltage converter circuit 21, (d) is a graph of the output voltage Vsub2 from the complementary current-voltage converter circuit 22, and (e) is a graph of the clock CLK from the clock generator circuit 100.

As shown in FIGS. 17 to 19, it could be confirmed that both of the output voltages Vc1 and Vc2 are sawtooth waves, which fell in the vicinity of the reference voltage Vref. In addition, it could be confirmed that the output voltages Vsub1 and Vsub2 rose for the comparison voltage holding interval as the offset voltage ΔV was greater. Further, it could be confirmed that influence of the offset voltages and the delays of the comparators 14 and 24 on the clock CLK could be removed in one clock cycle. As shown in FIG. 18, it is noted that the output voltages Vsub1 and Vsub2 do not coincide with the reference voltage Vref for the comparison voltage holding interval when the offset voltage Voff is 0 mV. This is because the clock generator circuit 100 corrects also the delays due to the comparators 14 and 24.

Figure 20:
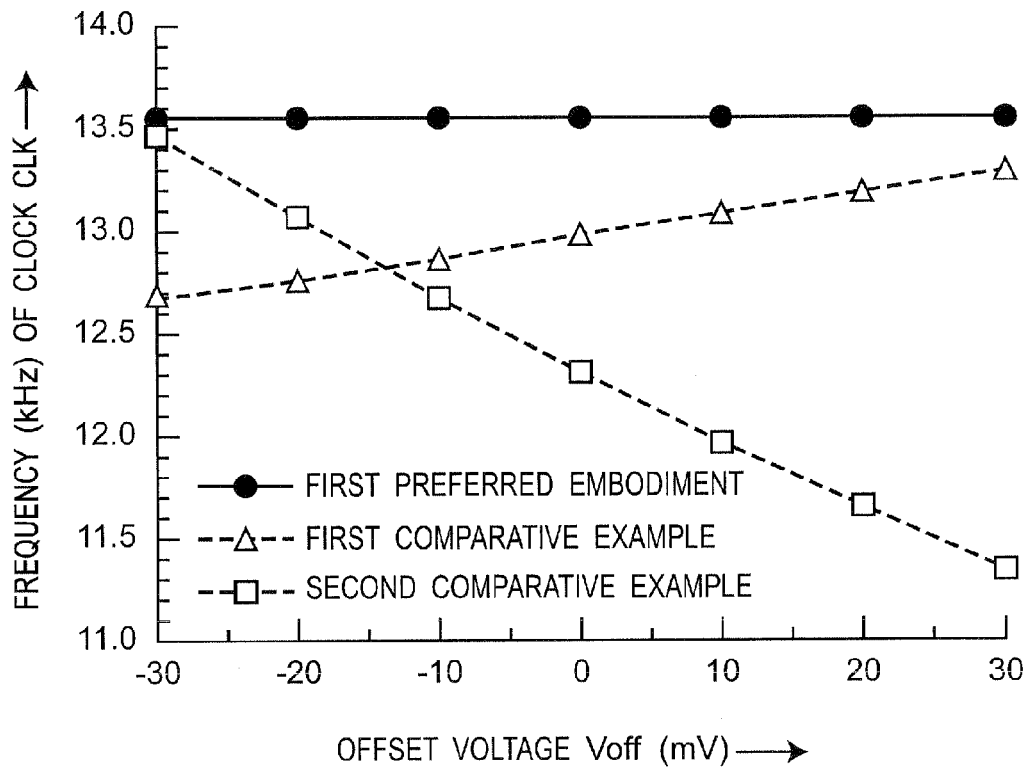
FIG. 20 is a graph showing simulation results of a relation between the offset voltage Voff and a frequency of the clock CLK in each of the clock generator circuit 100 of the first preferred embodiment, the clock generator circuit 100B of the first comparative example, and the clock generator circuit 100C of the second comparative example.

FIG. 20 is a graph showing simulation results of a relation between the offset voltage Voff and the frequency of the clock CLK in each of the clock generator circuit 100 of the first preferred embodiment, the clock generator circuit 100B of the first comparative example, and the clock generator circuit 100C of the second comparative example. The offset voltage dependence of the clock frequency was evaluated at 27° C. In the case of the clock generator circuit 100B of the first comparative example and the clock generator circuit 100C of the second comparative example, which do not use the comparison voltages Vcmp1 and Vcmp2, it could be confirmed that the clock frequency linearly changed with respect to the offset voltage Voff.

Concretely speaking, the rate of change of the clock frequency with respect to the offset voltage Voff was 80.89%/V (fluctuation range was 630 Hz) in the case of the first comparative example, and 288.60%/V (fluctuation range was 2140 Hz) in the case of the second comparative example. On the other hand, the rate of change of the clock frequency with respect to the offset voltage Voff was 0.33%/V (fluctuation range was 2.7 Hz) in the case of the clock generator circuit 100 of the first preferred embodiment, and it could be confirmed that the rate was more largely reduced than in the first and second comparative examples. The reason why the clock frequency is varied in the first preferred embodiment, the first comparative example and the second comparative example when the offset voltage Voff is 0 V is that the delays of the comparators 14 and 24 are also canceled in the first preferred embodiment.

Figure 21:
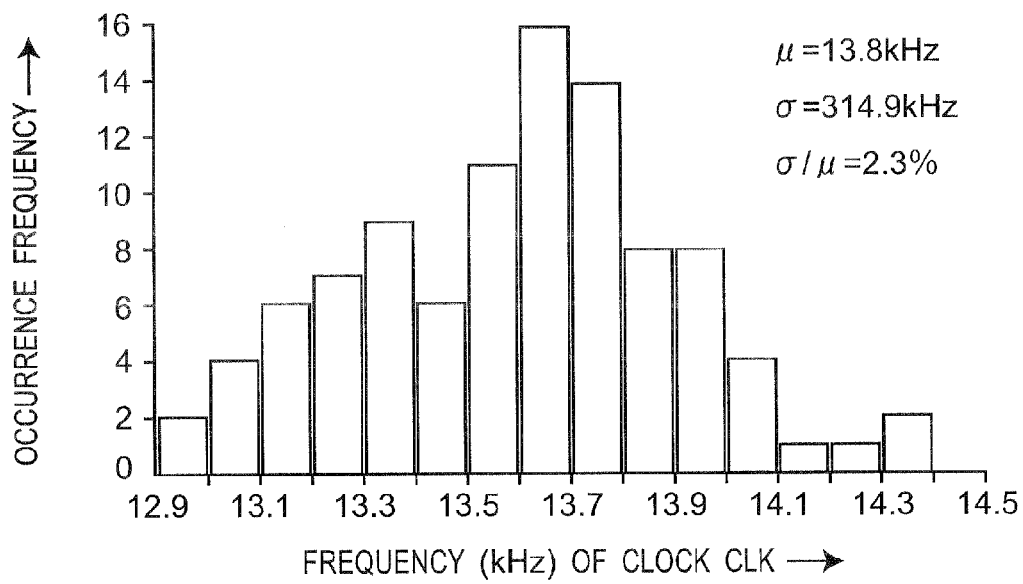
FIG. 21 is a histogram showing a distribution of the frequency of the clock CLK as results of Monte Carlo simulation (100 times) in the clock generator circuit 100 of the first preferred embodiment.

FIG. 21 is a histogram showing a distribution of the frequency of the clock CLK as results of Monte Carlo simulation (100 times) in the clock generator circuit 100 of the first preferred embodiment. By setting the temperature at 27° C., variations in the clock frequency were evaluated. As shown in FIG. 21, the coefficient of variation (standard deviation σ/average value μ) of an index to evaluate the variations was 2.3%, the minimum value of the clock frequency was 12.92 kHz, and the maximum value of the clock frequency was 14.32 kHz in the first preferred embodiment.

Figure 22:
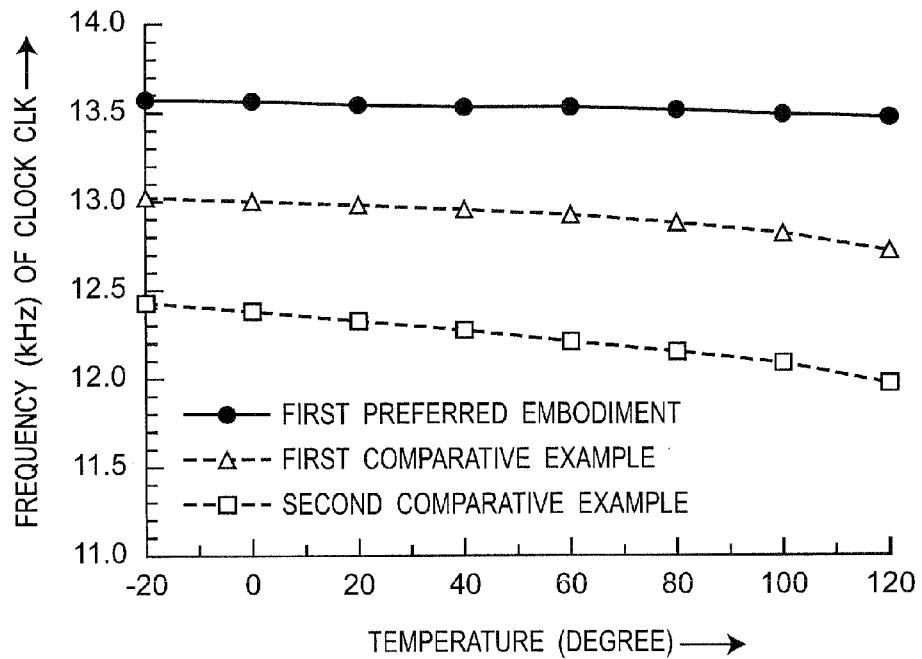
FIG. 22 is a graph showing simulation results of a relation between the temperature and the frequency of the clock CLK in each of the clock generator circuit 100 of the first preferred embodiment, the clock generator circuit 100B of the first comparative example, and the clock generator circuit 100C of the second comparative example.

FIG. 22 is a graph showing simulation results of a relation between the temperature and the frequency of the clock CLK in each of the clock generator circuit 100 of the first preferred embodiment, the clock generator circuit 100B of the first comparative example, and the clock generator circuit 100C of the second comparative example. By varying the temperature within a range of −20° C. to 120° C., the temperature dependence of the clock frequency was evaluated. As shown in FIG. 22, the clock frequency slightly decreases as a rise in the temperature in the first preferred embodiment. In addition, in the case of the first preferred embodiment, the fluctuation range of the clock frequency was 80 Hz, which was smaller than in the first comparative example and the second comparative example.

Figure 23:
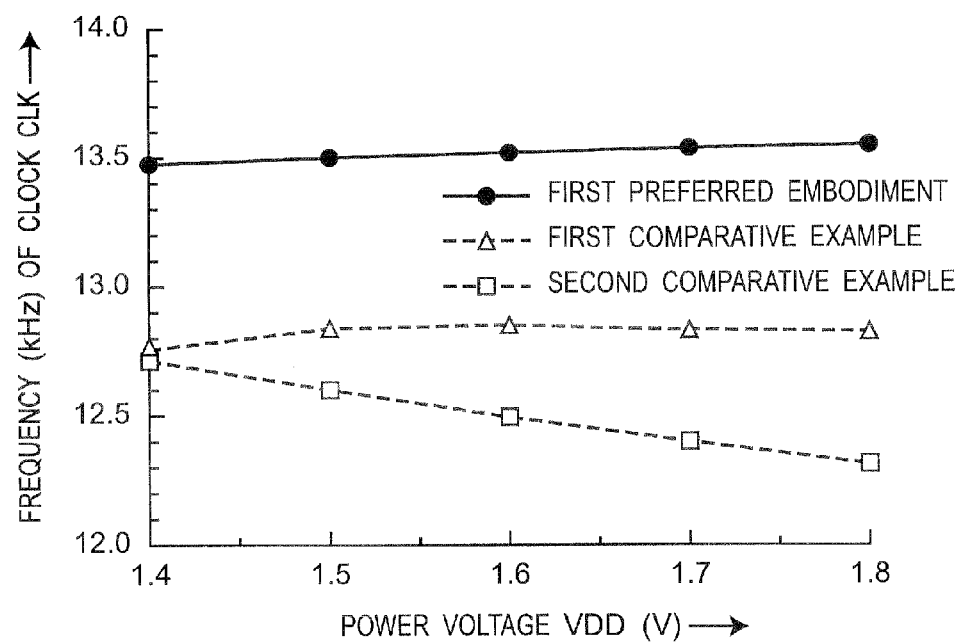
FIG. 23 is a graph showing simulation results of a relation between the power voltage VDD and the frequency of the clock CLK in each of the clock generator circuit 100 of the first preferred embodiment, the clock generator circuit 100B of the first comparative example, and the clock generator circuit 100C of the second comparative example.

FIG. 23 is a graph showing simulation results of a relation between the power voltage VDD and the frequency of the clock CLK in each of the clock generator circuit 100 of the first preferred embodiment, the clock generator circuit 100B of the first comparative example, and the clock generator circuit 100C of the second comparative example. The fluctuation range of the clock frequency upon varying the power voltage VDD from 1.4 V to 1.8 V was evaluated. As shown in FIG. 23, the clock frequency slightly increases with a rise in the power voltage VDD in the case of the first preferred embodiment. This is presumably ascribed to the fact that the influence of the delay in the digital circuit part of the clock generator circuits 100 is reduced. In addition, the fluctuation range of the clock frequency was 80 Hz, and the line regulation was 1.48%/V, which were smaller than in the first comparative example and the second comparative example.

As described above, according to the first preferred embodiment, it could be confirmed that the influences of the delays and the offset voltages of the comparators 14 and 24 were removed, and the fluctuation range of the clock frequency could be largely reduced in comparison with the first comparative example and the second comparative example.

Figure 24:
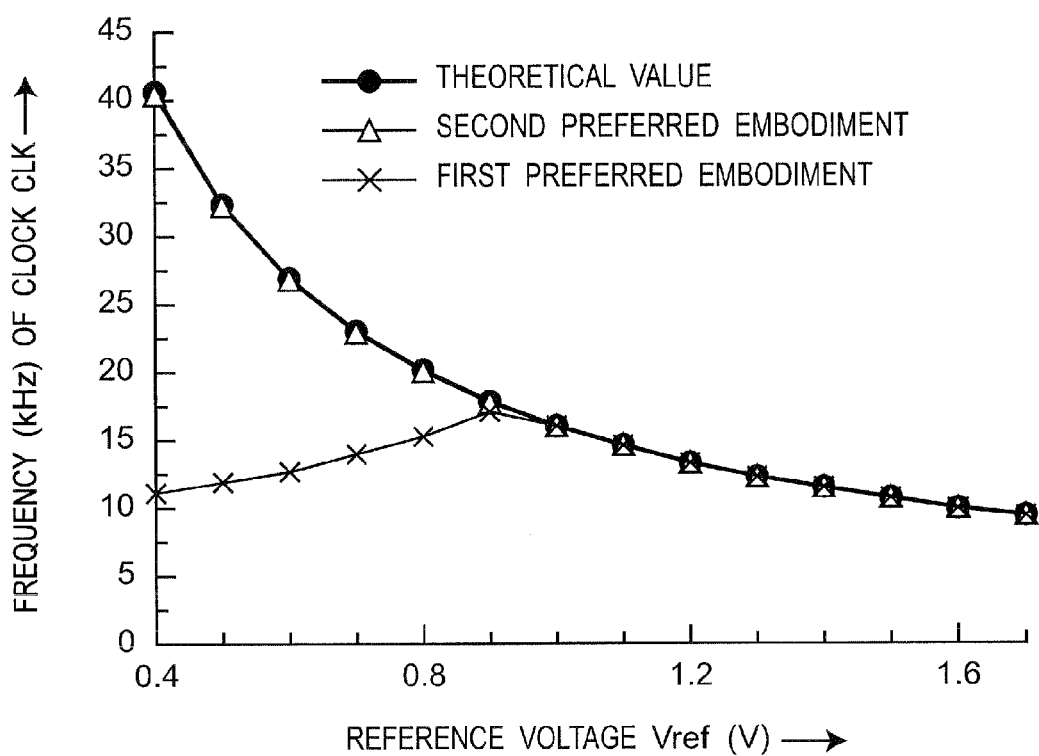
FIG. 24 is a graph showing simulation results of a relation between the reference voltage Vref and the frequency of the clock CLK in each of the clock generator circuit 100 of the first preferred embodiment and the clock generator circuit 100A of the second preferred embodiment, and theoretical relation between the reference voltage Vref and the frequency of the clock CLK.

FIG. 24 is a graph showing simulation results of a relation between the reference voltage Vref and the frequency of the clock CLK in each of the clock generator circuit 100 of the first preferred embodiment and the clock generator circuit 100A of the second preferred embodiment, and theoretical relation between the reference voltage Vref and the frequency of the clock CLK. The clock frequency upon varying the reference voltage Vref from 0.4 to 1.7 V was evaluated. Since the restriction (Equation (2)) of the reference voltage Vref is canceled in the case of the second preferred embodiment, it can be confirmed that the clock frequency almost coincides with the theoretical value (Iref/(2CVref)). On the other hand, the results indicated that the clock frequency largely differed from the theoretical value when the reference voltage Vref fell below VDD/2 and the condition of the Equation (2) was not satisfied in the case of the first preferred embodiment.

Industrial Applicability

As described above in detail, according to the relaxation oscillator circuit of the present invention, for the comparison voltage generating interval, the control circuit holds the second output voltage when the level of the output signal from the comparator is inverted as the comparison voltage of the comparator. For the clock generating interval, the control circuit charges the first capacitor with the first constant current until the level of the output signal from the comparator is inverted. In addition, the control circuit controls the first and second clock generator subcircuits, so that one subcircuit of the first and second clock generator subcircuits operates for the comparison voltage generating interval, then another subcircuit operates for the clock generating interval, and so that the first and second clock generator subcircuits alternately repeat processes of the comparison voltage generating interval and the clock generating interval. The control circuit generates a clock based on output signals from the comparators of the first and second clock generator subcircuits. Therefore, according to the relaxation oscillator circuit of the present invention, it is possible to generate a clock having a frequency more constant than that of the prior art.

Although the present disclosure has been fully described in connection with the preferred embodiments thereof with reference to the accompanying drawings, it is to be noted that various changes and modifications are apparent to those skilled in the art. Such changes and modifications are to be understood as included within the scope of the present disclosure as defined by the appended claims unless they depart therefrom.

What is claimed is:

1. A relaxation oscillator circuit comprising:
   first and second clock generator subcircuits; and
   a control circuit configured to control the first and second clock generator subcircuits,
   wherein each of the first and second clock generator subcircuits comprises:
   a comparator having a non-inverted input terminal and an inverted input terminal;
   a first current-voltage converter circuit including a first capacitor having a grounded first electrode and a second electrode, the first current-voltage converter circuit outputting, as a first output voltage, a voltage of the second electrode of the first capacitor upon charging the first capacitor with a first constant current;

a multiplexer configured to output one of the first output voltage and a predetermined reference voltage, to the non-inverted input terminal of the comparator; and a second current-voltage converter circuit including a second capacitor having first and second electrodes, the first electrode being connected to a power source that outputs a predetermined power voltage and a second electrode, wherein the second current-voltage converter circuit outputs, as a second output voltage, a voltage of the second electrode of the second capacitor upon discharging the second capacitor with a second constant current, to the inverted input terminal of the comparator, wherein, for an interval of generating a comparison voltage, the control circuit grounds the second electrode of the first capacitor, controls the multiplexer to output the reference voltage to the non-inverted input terminal of the comparator, discharges the second capacitor with the second constant current after resetting the second electrode of the second capacitor to a predetermined reset voltage that is higher than the reference voltage and equal to or lower than the power voltage, and holds the second output voltage when a level of an output signal from the comparator is inverted as a comparison voltage of the comparator, and wherein, for a clock generating interval, the control circuit controls the multiplexer to output the first output voltage to the non-inverted input terminal of the comparator, and charges the first capacitor with the first constant current until the level of the output signal from the comparator is inverted, wherein the control circuit controls the first and second clock generator subcircuits, so that one subcircuit of the first and second clock generator subcircuits operates for the interval of generating the comparison voltage, then another subcircuit operates for the clock generating interval, and so that the first and second clock generator subcircuits alternately repeat processes of the interval of generating the comparison voltage and the clock generating interval, and wherein the control circuit generates a clock based on output signals from the comparators of the first and second clock generator subcircuits.

2. The relaxation oscillator circuit as claimed in claim 1, wherein the first current-voltage converter circuit comprises:

a first switch connected to the second electrode of the first capacitor, and which switches over between charging the first capacitor with the first constant current and not charging the first capacitor; and a second switch connected in parallel with the first capacitor, wherein the second current-voltage converter circuit comprises:

a third switch connected to the second electrode of the second capacitor, and which switches over between discharging the second capacitor with the second constant current and not discharging the second capacitor; and a fourth switch connected in parallel with the second capacitor, and wherein, for the interval of generating the comparison voltage, the control circuit (a) controls the first switch not to charge the first capacitor and turns on the second switch, and controls the third switch not to discharge the second capacitor and turns on the fourth switch, (b) controls the third switch to discharge the second capacitor and turns off the fourth switch, (c) when the level of the output signal from the comparator is inverted, controls the third switch not to discharge the second capacitor and turns off the fourth switch, and wherein, for the clock generating interval, the control circuit (d) controls the first switch to charge the first capacitor and turns off the second switch.

3. The relaxation oscillator circuit as claimed in claim 1, wherein the control circuit comprises:

a NAND gate configured to execute a non-conjunction operation on the respective output signals from the first and second clock generator subcircuits; and a flip-flop configured to detect respective falling edges of an output signal from the NAND gate, and generate the clock based on timings of respective detected falling edges.

4. The relaxation oscillator circuit as claimed in claim 1, wherein capacitances of the first and second capacitors of the first and second clock generator subcircuits are set to substantially same value as each other, and wherein current values of the first and second constant currents are set to substantially same current value as each other.

5. The relaxation oscillator circuit as claimed in claim 1, wherein the comparison voltage includes the reference voltage and an error voltage of the comparator.

* * * * *